(12) United States Patent
Nieminen

(10) Patent No.: US 8,446,813 B1
(45) Date of Patent: May 21, 2013

(54) METHOD, APPARATUS AND COMPUTER PROGRAM FOR SOLVING CONTROL BITS OF BUTTERFLY NETWORKS

(71) Applicant: Renesas Mobile Corporation, Tokyo (JP)

(72) Inventor: Esko Juhani Nieminen, Oulu (FI)

(73) Assignee: Renesas Mobile Corporation, Tokyo (JP)

(*) Notice: Subject to any disclaimer, the term of this patent is extended or adjusted under 35 U.S.C. 154(b) by 0 days.

(21) Appl. No.: 13/676,375

(22) Filed: Nov. 14, 2012

(30) Foreign Application Priority Data

Jun. 29, 2012 (GB) .................................. 1211610.9

(51) Int. Cl.
*H04J 11/00* (2006.01)
*H04L 12/28* (2006.01)

(52) U.S. Cl.
USPC ........................................ 370/203; 370/351

(58) Field of Classification Search
USPC ...................................................... 370/203
See application file for complete search history.

(56) References Cited

U.S. PATENT DOCUMENTS

| | | | |
|---|---|---|---|
| 5,521,591 A * | 5/1996 | Arora et al. ................... | 340/2.21 |
| 7,724,163 B2 * | 5/2010 | Wong et al. ...................... | 341/81 |
| 7,839,310 B2 | 11/2010 | Nieminen | |
| 8,051,239 B2 | 11/2011 | Nieminen | |
| 8,090,896 B2 | 1/2012 | Nieminen | |
| 2002/0141427 A1 * | 10/2002 | McAlpine ...................... | 370/413 |
| 2003/0002474 A1 * | 1/2003 | Alexander et al. ............ | 370/351 |

OTHER PUBLICATIONS

Search Report under Section 17 dated Oct. 22, 2012 which is issued in a related British Application No. GB1211610.9 (4 pages).

\* cited by examiner

*Primary Examiner* — Brandon Renner
*Assistant Examiner* — Gerald Smarth
(74) *Attorney, Agent, or Firm* — Robert P. Michal; Lucas & Mercanti LLP

(57) ABSTRACT

Control bits for switches of a butterfly network are directly solved iteratively for each successive functional column of switches to route data values in parallel according to a multiple access scheme through the butterfly network to memory spaces. A memory space address and appended bus index leading into the butterfly network are generated. A linear order bus index and a physical address are determined for a switch having an unsolved control bit. The solved control bits are applied to solve control bits to a next functional column in a linear and an interleaved order by starting from the bus index and physical address. The linear order is moved to the interleaved order by a reduced turbo de-interleaver and the interleaved order is moved to the linear order by a reduced turbo interleaver until solving a sequence of control bits related to the start bus index and the start physical address.

24 Claims, 10 Drawing Sheets

1002: directly solve control bits for a butterfly network of switches iteratively for each successive functional column of the switches so as to route data values in parallel according to a multiple access scheme through the butterfly network to a plurality of memory spaces;
- for each of the data values, generate an address of one of the memory spaces with an appended bus index leading into the butterfly network of switches based on the multiple access scheme; and
- apply the solved control bits to the switches of the butterfly network so as to solve control bits to a next functional column of the butterfly network of switches in a linear order access and in an interleaved order access by starting from the bus index $j$ and the physical address $k$ of the linear order access

1004: for a switch without solved control bits, compute a start bus index $j$ and a start physical address $k$ for the linear order access, and other bus indexes and physical addresses for the linear order access are obtained from a reduced turbo interleaver at bus indexes and physical addresses of an interleaved access order one bus index and one address at time
where directly solving the control bits comprises:
- for each of $2^y$ data values to be read from or written to one of $2^y$ memory spaces in parallel, where y is an integer, functional column by functional column for switches of the butterfly network of y columns, a control bit of a switch for the linear order access is solved on a route from a bus of an index for the linear order access to one of the $2^y$ memory spaces with a physical address for the linear order access of the $2^y$ data values in parallel

1006: a bus index $n_{k,j}$ and a physical address $m_{k,j}$ for the interleaved order access are obtained from a reduced turbo de-interleaver at a bus index and a physical address of a linear access order;
and where directly solving the control bits further comprises:
functional column by functional column for switches of the butterfly network of y columns, solving an interleaved order access control bit $\beta_{j,k}$ of a switch on a route from the bus of the bus index for the interleaved order access to one of the $2^y$ memory spaces with the physical address for the interleaved order access of the $2^y$ data values in parallel

*FIG. 10*

METHOD, APPARATUS AND COMPUTER PROGRAM FOR SOLVING CONTROL BITS OF BUTTERFLY NETWORKS

CROSS REFERENCE TO RELATED APPLICATION

This application claims the benefit under 35 U.S.C. §119(a) and 37 CFR §1.55 to UK Patent Application No. 1211610.9, filed on Jun. 29, 2012, the entire content of which is incorporated herein by reference.

TECHNICAL FIELD

The present invention relates to a method, apparatus and computer program for solving control bits of butterfly networks. The exemplary and non-limiting embodiments of this invention relate generally to wireless communication systems, methods, devices and computer programs and, specific examples relate to control bits for switching or butterfly networks which control the selection of memory spaces for turbo decoding purposes.

BACKGROUND INFORMATION

Forward error correction is quite commonplace in modern wireless communications. Decoders of channel codes, such as may be present in a modem or other hardware component, utilise parallel processing turbo decoders to decode turbo codes of high speed user data in order to achieve data rates exceeding 40 Mbps in the 3G WCDMA (wideband code division multiple access) standard which is sometimes referred to as HSDPA (high speed downlink packet access). Many other radio access technologies also require turbo coding of user data.

Such high user data rates in HSDPA and other technologies require that a turbo decoder process data in parallel, typically four or eight soft data bits at a time. In order to do so one has to solve parallel access contentions because a turbo decoder processes soft data bits in two different orders, an ascending order and an interleaved order. Butterfly networks are a well known technique for routing soft data bits between a decoder core and eight (or four) memories (memory spaces). One prior art reference by the inventor herein which details butterfly networks for turbo decoding purposes is U.S. Pat. No. 8,051,239 entitled Multiple Access for Parallel Turbo Decoder.

In very general terms, U.S. Pat. No. 8,051,239 discloses solution of a given multiple access function and the control bits which control the individual switches of the butterfly network can be resolved from that multiple access function. The original memory space addresses are used together with a desired parallel access scheme. Since conceiving the invention in U.S. Pat. No. 8,051,239 the inventor herein has determined that this technique can be improved as is detailed below.

SUMMARY

In a first exemplary embodiment of the invention, there is a method including: directly solving control bits for a butterfly network of switches iteratively for each successive functional column of the switches so as to route data values in parallel according to a multiple access scheme through the butterfly network of switches to a plurality of memory spaces by:

for each of the data values, generating an address of one of the memory spaces with an appended bus index leading into the butterfly network of switches based on the multiple access scheme;

detecting a switch in a functional column of the butterfly network in a linear order access having an unsolved control bit;

determining a bus index j and a physical address k for the switch in input of the butterfly network in a linear order access;

applying the solved control bits to the switches of the butterfly network so as to solve control bits to a next functional column of the butterfly network of switches in a linear order access and in an interleaved order access by starting from the bus index j and the physical address k; and moving from the butterfly network of switches in the linear order to the butterfly network of switches in the interleaved order by a reduced turbo de-interleaver and from the butterfly network of switches in the interleaved order to the butterfly network of switches in the linear order by a reduced turbo interleaver until a sequence of control bits related to the start bus index j and the start physical address k has been solved.

In a second exemplary embodiment of the invention, there is apparatus for controlling a turbo decoder, the apparatus including a processing system which includes at least one memory including computer program code and at least one processor, in which the processing system is configured to cause the apparatus to directly solve control bits for a butterfly network of switches iteratively for each successive functional column of the switches so as to route data values in parallel according to a multiple access scheme through the butterfly network of switches to a plurality of memory spaces by:

for each of the data values, generating an address of one of the memory spaces with an appended bus index leading into the butterfly network of switches based on the multiple access scheme;

detecting a switch in a functional column of the butterfly network in a linear order access having an unsolved control bit;

determining a bus index j and a physical address k for the switch in input of the butterfly network in a linear order access;

applying the solved control bits to the switches of the butterfly network so as to solve control bits to a next functional column of the butterfly network of switches in a linear order access and in an interleaved order access by starting from the bus index j and the physical address k; and moving from the butterfly network of switches in the linear order to the butterfly network of switches in the interleaved order by a reduced turbo de-interleaver and from the butterfly network of switches in the interleaved order to the butterfly network of switches in the linear order by a reduced turbo interleaver until a sequence of control bits related to the start bus index j and the start physical address k has been solved.

In a third exemplary embodiment of the invention, there is a computer-readable memory including a set of instructions, which, when executed on a turbo decoder, causes the turbo decoder to perform the steps of: directly solving control bits for a butterfly network of switches iteratively for each successive functional column of the switches so as to route data values in parallel according to a multiple access scheme through the butterfly network of switches to a plurality of memory spaces by:

for each of the data values, generating an address of one of the memory spaces with an appended bus index leading into the butterfly network of switches based on the multiple access scheme;

detecting a switch in a functional column of the butterfly network in a linear order access having an unsolved control bit;

determining a bus index j and a physical address k for the switch in input of the butterfly network in a linear order access;

applying the solved control bits to the switches of the butterfly network so as to solve control bits to a next functional column of the butterfly network of switches in a linear order access and in an interleaved order access by starting from the bus index j and the physical address k; and moving from the butterfly network of switches in the linear order to the butterfly network of switches in the interleaved order by a reduced turbo de-interleaver and from the butterfly network of switches in the interleaved order to the butterfly network of switches in the linear order by a reduced turbo interleaver until a sequence of control bits to the start bus index j and the start physical address k has been solved.

In a further exemplary embodiment of the invention there is an apparatus including computing means and solving means. The computing means is for appending to memory addresses bus information identifying which of a plurality of busses carry the respective memory addresses. The solving means is for iteratively accessing memory spaces of the at least one memory using the memory addresses with the appended bus information, in which individual ones of the memory addresses uniquely identify one of the memory spaces. Together the computing means and the solving means operate to directly solve control bits for a butterfly network of switches iteratively for each successive functional column of the switches so as to route data values in parallel according to a multiple access scheme through the butterfly network of switches to a plurality of memory spaces in the manner detailed above in the bulleted entries for the first through third embodiments. In one implementation of this fourth embodiment the computing means and the solving means is one or more processors such as may be embodied on a computer chip or chips, and executing program code.

In the specific examples below which show utilisation of these teachings for turbo coding, first control bits of individual switches of a butterfly network are solved using the memory addresses with the appended bus information, and once those control bits are asserted to set the switches in the butterfly network then the memory spaces can be accessed.

Further features and advantages of the invention will become apparent from the following description of preferred embodiments of the invention, given by way of example only, which is made with reference to the accompanying drawings.

BRIEF DESCRIPTION OF THE DRAWINGS

FIG. 10 shows a logic flow diagram that illustrates from the perspective of a radio device, such as for example a user terminal or a base station, the operation of an example of a method, and a result of execution of computer program instructions embodied on a computer readable memory, in accordance with an exemplary embodiment of this invention.

DETAILED DESCRIPTION

The inventor has determined that there is a more powerful technique than that set forth in U.S. Pat. No. 8,051,239. In these teachings the control bits for setting the switches in a butterfly network are solved by using the physical memory addresses and also indexes or information about which bus is carrying a given data word for that particular memory address. Adding to the data (the memory addresses) which pass through the switching network (butterfly network) information identifying which bus is carrying the data has wide uses beyond only turbo coding, and can in general be utilised in any mathematical operation that iteratively accesses memory spaces through a switching network. Thus the examples below which are in the context of turbo decoding operations are not limiting. Specific for the turbo decoding operations are further details as to solving control bits which control individual switches of the switching/butterfly network.

Figure 1A:
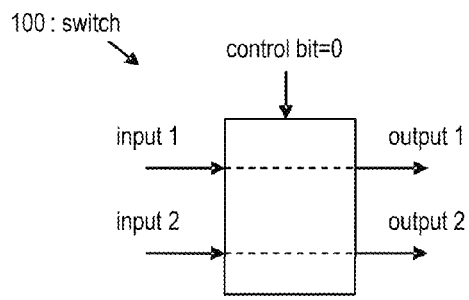
FIGS. 1A and 1B show schematically detail of a single switch of a butterfly network with the control bit set at different values.
Figure 1B:
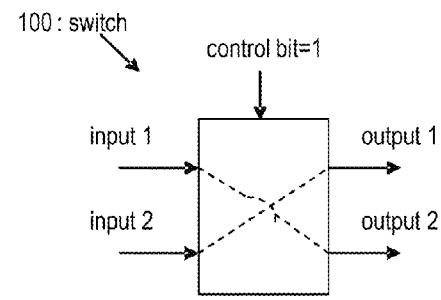

FIGS. 1A and 1B illustrate one exemplary switch 100 of a butterfly network with its two inputs coupled to its two outputs differently due to different control bit values applied at FIGS. 1A and 1B. The switch 100 is of the type double-pole double-throw and so is controlled in the minimum by a single bit; FIG. 1A illustrates pole interconnections for a zero-valued control bit and FIG. 1B illustrates pole interconnections for a one-valued control bit. Especially the switch 100 is a double-pole double throw switch internally wired to reverse connections between the input poles and the output poles. It has two pairs of poles that it connects either straight through or crossed over. In the first throw position of FIG. 1A, inputs 1 and 2 are operatively coupled to respective outputs 1 and 2, illustrated as straight connections. In the opposite second throw position of FIG. 1B, inputs 1 and 2 are operatively coupled to respective outputs 2 and 1, illustrated as crossed connections. One input can lie on one and only one output at any given instant for any given switch 100. In butterfly networks, each switch is directionless; data may pass from the poles on the left side (labelled as inputs) to the poles on the right side (labelled as outputs) as indicated by the arrows in FIGS. 1A-B; or data may pass from the right-side poles to the left-side poles.

Other implementations of a butterfly network may utilise triple-pole double-throw or more generally x-pole double-throw switches, each still being controlled by a single control bit which governs the double throw of the switch. For implementations with multi-throw switches, there will be a minimum of y control bits per switch where the number of throws is $2^y$ or less (x and y are positive integers). Some switching networks may even employ of mixture of switches having different numbers of poles and/or throws. For simplicity of this description, the exemplary but non-limiting butterfly network consists of twelve double-pole double-throw switches each controlled by a single bit.

As was noted above, U.S. Pat. No. 8,051,239 solves a given multiple access function, and from that the control bits for the butterfly network switches can be resolved. The turbo decoding implementations of these teachings take a different approach, directly solving control bits of butterfly networks for both the linear (ascending) and the interleaved access orders and a given degree of parallel processing/parallel accesses, without the so called multiple access functions. This may be considered a first part of embodiments of the invention, where a second part concerns replacing the original multiple access schemes with new ones which enables a faster and simpler resolution of the control bits for the first part as compared to the techniques detailed at U.S. Pat. No. 8,051,239. The new multiple access schemes can be utilised to deduce new efficient representations for turbo interleavers. This second part has a wide variety of uses beyond only turbo coding.

Figure 2A:
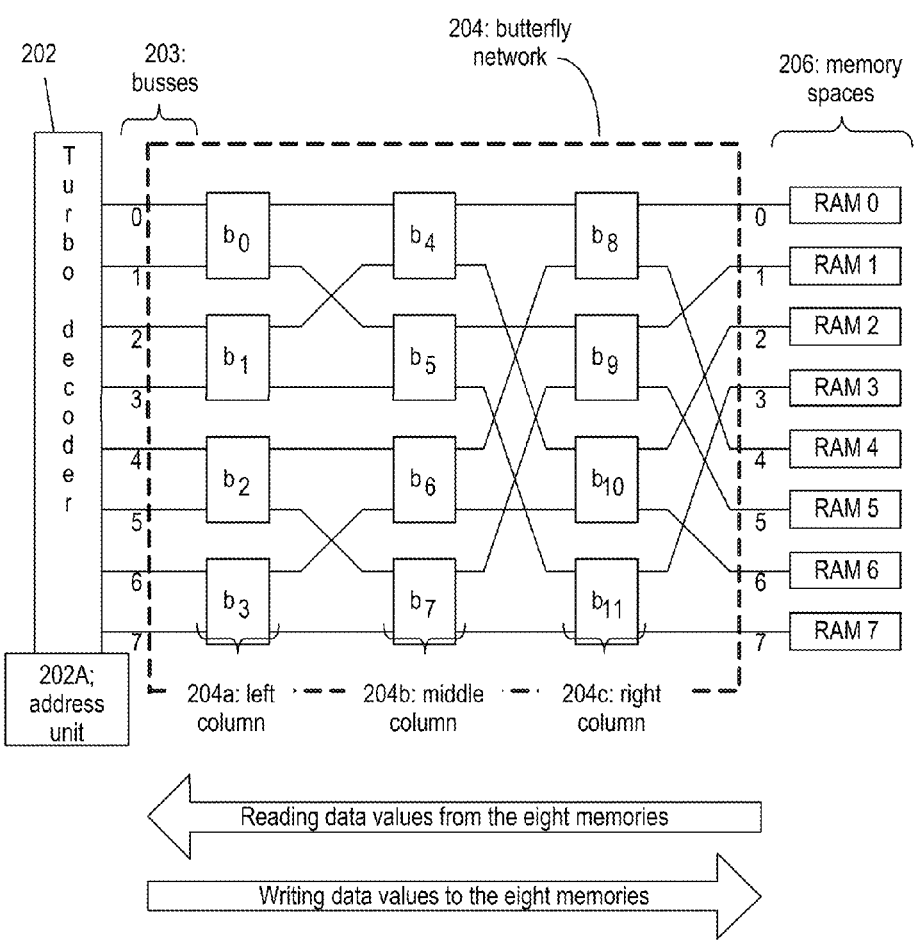
FIG. 2A shows schematically an example of a butterfly network of twelve switches arranged to enable 8-tuple parallel access of eight memory spaces for turbo decoding according to an exemplary embodiment of these teachings.

With respect to solving the control bits in the first part, consider the example butterfly network of FIG. 2A in which the parallel 8-tuple access capability of the turbo decoder 202 is accessed by the eight busses 203 indexed as 0-7. This turbo decoder 202 uses the illustrated 8-tuple butterfly network 204 for routing data on the eight buses 0-7 between the decoder 202 and the eight memories 206 identified as RAM0-RAM7. Within the 8-tuple butterfly network 204 are twelve switches identified as $b_0$ through $b_{11}$, each being functionally identical to the switch 100 shown at FIGS. 1A-B. To solve the 12 control bits for these twelve switches there is an algorithm which solves them serially column-by-column:

a $1^{st}$ step is to solve the four bits $b_0$-$b_3$ on the left column 204a a $2^{nd}$ step is to solve the four control bits $b_4$-$b_7$ on the middle column 204b a $3^{rd}$ step is to solve the remaining four bits $b_8$-$b_{11}$ on the right column 204c.

Other solutions known to the inventor do not deal with control bits of a butterfly network directly, but instead apply the concept of multiple access functions. These other solutions solve a multiple access function first and solve the control bits only afterwards, and noted above for U.S. Pat. No. 8,051,239. The direct-solving algorithm summarised above and detailed with particularity below simplifies the control bit resolution process quite significantly.

While this description is in terms of columns of switches, in practice a semiconductor chip embodying a butterfly network need not dispose the various switches into orderly physical columns as FIG. 2A illustrates. The functional relation among the various switches is controlling rather than the physical disposition relative to one another. Stated functionally, the left column 204a noted for FIG. 2A consists of all switches having inputs that do not directly connect to outputs of other switches of the butterfly network, the right column 204c noted for FIG. 2A consists of all switches having outputs that do not directly connect to inputs of other switches of the butterfly network, and the middle column 204b noted for FIG. 2A consists of all switches directly connected to switches which lie in the left column and to switches which lie in the right column. "Directly connected" means there is no intervening switch. As used herein, the term "functional columns of switches" refers to the above direct interconnectedness among switches, regardless of how such switches may be physically disposed in a semiconductor chip or other implementing medium.

The principle of these examples can of course be extended to any integer number y (functional) columns of switches. Using variable x to index from 1 to y; column x=1 is the above left column and column x=y is the above right column, while any intermediate $x^{th}$ column consists of all switches having inputs directly connected to outputs of switches in the $(x-1)^{th}$ column and also outputs directly connected to inputs of switches in the $(x+1)^{th}$ column. For data moving in the opposite right to left direction (see FIG. 2A), the nomenclature above is reversed so that left is right and vice versa, and so that input is output and vice versa.

A butterfly network of y columns of $2^{y-1}$ switches has $2^y$ input pins, $2^y$ output pins, and $y*2^{y-1}$ switches with a $y*2^{y-1}$-bit wide control signal, one control bit per switch. A $2^y$-tuple butterfly network is able to permute $2^y$ data buses at a time. A total number of possible permutations is $2^z$ with $z=y*2^{y-1}$.

Figure 3A:
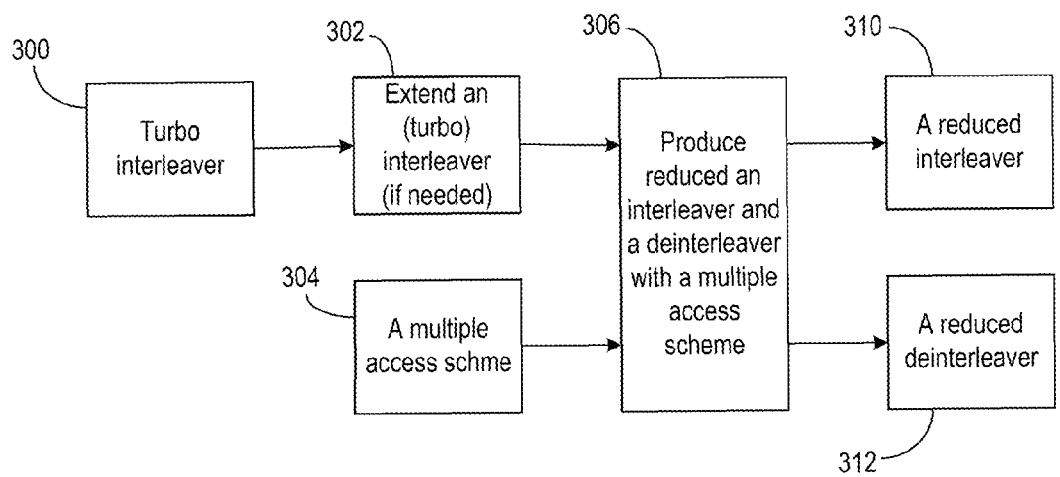
FIG. 3A shows a schematic process diagram illustrating an example of transfer of a given turbo interleaver to a reduced interleaver and to a reduced interleaver in a general manner that states a problem solved by exemplary embodiments of these teachings.
Figure 3B:
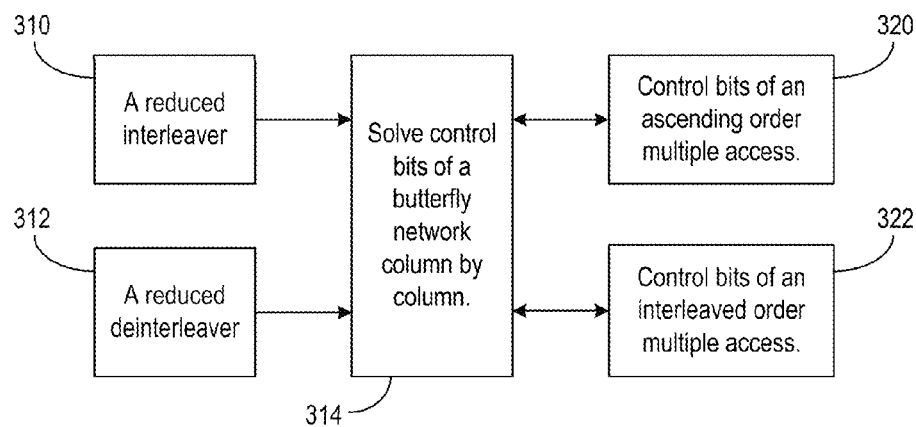
FIG. 3B shows a schematic process diagram illustrating a broad overview of how examples of embodiments of these teachings solve the general problem set forth at FIG. 3A.

FIG. 3A shows a process flow diagram in sufficiently general terms as to reflect a problem statement which the below embodiments solve, namely how to transfer a given turbo interleaver such as might be present in a turbo decoder 202 to a reduced interleaver 310 and to a reduced de-interleaver 312. If additional memory spaces are needed for processing the data, the turbo interleaver can be extended 302. Regardless, a multiple access scheme 304 is applied so as to produce at block 306 a reduced interleaver 310 and a reduced de-interleaver 312 reflecting the parallel access and the interleaved access which that multiple access scheme applies to re-order the data in the various memory spaces 206. FIG. 3B shows how that multiple access scheme operates according to these teachings.

The reduced interleaver 310 and reduced de-interleaver 312 may be separate memories from those of the turbo decoder 202 itself, and in this case an embodiment of the invention may be implemented for the parallel and the interleaved access even before the turbo decoder is powered up. In a more practical implementation where these teachings operate on memory spaces 206 of the reduced interleaver 310 and reduced de-interleaver 312 that are separate from those of the turbo decoder 202 they serve, the turbo decoder 202 is decoding data that was previously accessed according to these teachings and the reduced interleaver 310 or reduced de-interleaver 312 are operating on a next access problem (assuming the next turbo interleaver is different).

Now with the reduced interleaver 310 and reduced de-interleaver 312 of FIG. 3A set as the starting points of the process shown at FIG. 3B, block 314 illustrates that the multiple access scheme operates by solving, column by column, control bits of the butterfly network 204 (FIG. 2A). One set of control bits puts the data in an ascending order (or more generally linear order) multiple access 320, and a different set of control bits puts the data in an interleaved order multiple access 322.

Figure 3C:
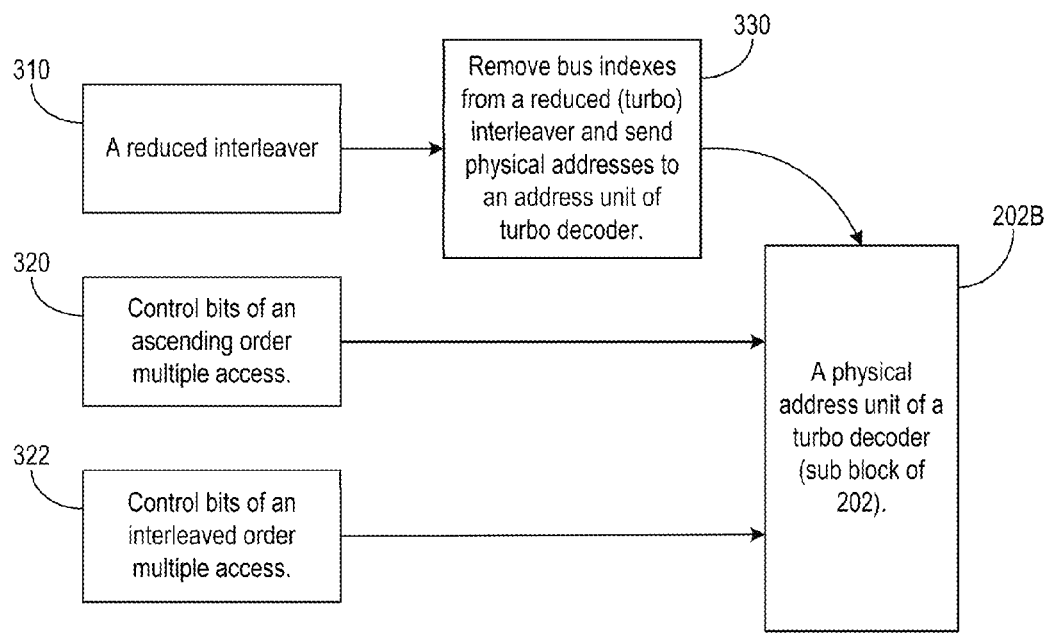
FIG. 3C shows a schematic process diagram illustrating an example of how a reduced interleaver such as that noted at FIGS. 3A-B is mapped to physical addresses that a physical address unit (e.g., a physical turbo interleaver) of a turbo decoder such as that at FIG. 2A can use according to these teachings.

FIG. 3C shows a process diagram illustrating an example of how the reduced interleaver 310 is mapped to the physical address unit of the turbo decoder. The physical address unit typically forms a part of the overall turbo decoder but other separate implementations are possible. At block 330 the bus indices are removed from the reduced interleaver 310, leaving the physical addresses to be sent to the address unit 202B (FIG. 3C) of the turbo decoder 202. The control bits for the ascending order 320 and for the interleaved order 322 are also sent to the turbo decoder address unit 202A, which applies them to the butterfly network 204 so as to get the proper data values in the proper order read back into the turbo decoder 202.

One exemplary implementation for obtaining the column-by-column control bits is detailed further below. Once those bits are obtained they are asserted to the respective switches of the butterfly network 204 to access the data in the memory spaces 206 in the ascending and in the interleaved order as shown in FIG. 2A. For this there is used is a turbo interleaver 300 (FIG. 3A) which is denoted hereinafter by T, an inverse turbo interleaver which is denoted hereinafter by $T^{-1}$, and a multiple access scheme. A length of the turbo interleaver T is denoted by N. The multiple access scheme simply describes which data values are accessed/read simultaneously in an ascending (linear) order and in an interleaved order. The multiple access scheme is valid in a data path before applying the butterfly network 204 to route data values between the turbo decoder 202 and the $2^3=8$ RAM memories 206 (having a number of memories $2^y$, where y is an integer), that is, at the point 203 in FIG. 2A in front of the 8-tuple butterfly network 204. If the eight busses 203 leading into the butterfly network 204 are indexed by the integer variable j, where j=0,1, ..., 7, then each $j^{th}$ bus is associated with an address function $a_j(k)$, where k=0,1, ..., N/8−1; the address functions $a_j(k)$ are mappings from the set $\{0,1,2, ..., N/8−1\}$ to the logical address space $\{0,1,2, ..., N−1\}$ of the RAM 206 and have disjoint images: $a_i(k) \neq a_j(k)$ for $i \neq j$, i,j=0,1,2, ..., 7, and for k=0,1,2, ..., N/8−1.

The ascending order 8-tuple access is then a vector of data values with (logical) addresses:

$a_0(k)$, $a_1(k)$, $a_2(k)$, $a_3(k)$, $a_4(k)$, $a_5(k)$, $a_6(k)$, $a_7(k)$ for k=0,1,2, ..., N/8−1.

The corresponding interleaved order 8-tuple access is a vector of data values with (logical) addresses in the RAM 206:

$T(a_0(k))$, $T(a_1(k))$, $T(a_2(k))$, $T(a_3(k))$, $T(a_4(k))$, $T(a_5(k))$, $T(a_6(k))$, $T(a_7(k))$ for k=0,1,2, ..., N/8−1.

The reason two different 8-tuple accesses are needed arises from the structure of turbo codes: data bits are encoded twice, once in the ascending order and then another time in the interleaved order. So a turbo decoder 202 has to process soft data values in those two different orders.

Now comes the second part in which a given multiple access scheme is replaced by another one such that the result provides a practical and efficient algorithm for solving controls bits. Each memory space address function for the RAM memory spaces 206 satisfies the unique relationship:

$a_j(k)$ corresponds to (k,j) for j=0,1,2, ..., 7 and k=0,1, 2, ..., N/8−1.

The ascending order 8-tuple access (logical) address vectors (for the RAM memory spaces 206):

$[a_0(k), a_1(k), a_2(k), a_3(k), a_4(k), a_5(k), a_6(k), a_7(k)]$ for k=0,1,2, ..., N/8−1 are replaced by the address vectors:

$[(k,0), (k,1), (k,2), (k,3), (k,4), (k,5), (k,6), (k,7)]$ for k=0, 1,2, ..., N/8−1.

The components of these new vectors for the ascending order 8-tuple access each have two parts, a physical address k of a data value stored at that physical address (RAM 0 through RAM 7 in FIG. 2A) and a bus index j, where j=0,1,2, ..., 7, which is valid at the point 203. In this manner, the ascending order 8-tuple parallel access can have the same physical addresses on every bus, independently of the original ascending order 8-tuple access scheme that utilised the prior art multiple access function.

In a similar fashion, the component address functions of an interleaved access scheme satisfy the two unique relationships:

$T(a_k(k)) = a_{m_{k;j}}(n_{k;j})$ for some $m_{k;j}$ and $n_{k;j}$;

and $a_{m_{k;j}}(n_{k;j})$ corresponds to $(n_{k;j}, m_{k;j})$ for j=0,1,2, ..., 7 and k=0;1,2, ..., N/8−1.

These two relationships together imply that the interleaver order 8-tuple address vectors for the RAM memory spaces 206 can be replaced by:

$[(n_{k;0}, m_{k;0}), (n_{k;1}, m_{k;1}), (n_{k;2}, m_{k;2}), (n_{k;3}, m_{k;3}), (n_{k;4}, m_{k;4}), (n_{k;5}, m_{k;5}), (n_{k;6}, m_{k;6}), (n_{k;7}, m_{k;7})]$ for k=0,1,2, ..., N/8−1. This replacement leads to a new turbo interleaver which is able to take into account physical addresses of the RAM 206, bus structure, and a given multiple access scheme simultaneously at the point 203. The new turbo interleaver is called hereafter a reduced turbo interleaver 310 and denoted by R. Its inverse interleaver 312 is denoted by $R^{-1}$. The reduced turbo interleaver R and its inverse interleaver $R^{-1}$ are defined by:

$R(k, j) = (n_{k;j}, m_{k;j})$ and $R^{-1}(n_{k;j}, m_{k;j}) = (k, j)$ for k=0,1,2, ..., N/8−1 and for j=0,1,2 ..., 7, and where $(n_{k;j}, m_{k;j})$ is determined as in the paragraph immediately above.

Each $n_{k;j}$ is an address to one of the 8 RAM memories 206 shown at FIG. 2A, and $m_{k;j}$ shows an index of a bus 203 shown at the left of FIG. 2A. Actual values for every $(n_{k;j}, m_{k;j})$ can be readily calculated from the above relationship $T(a_j(k)) = a_{m_{k;j}}(n_{k;j})$ because in practical cases the address functions $a_j(k)$ are known.

Figure 2B:
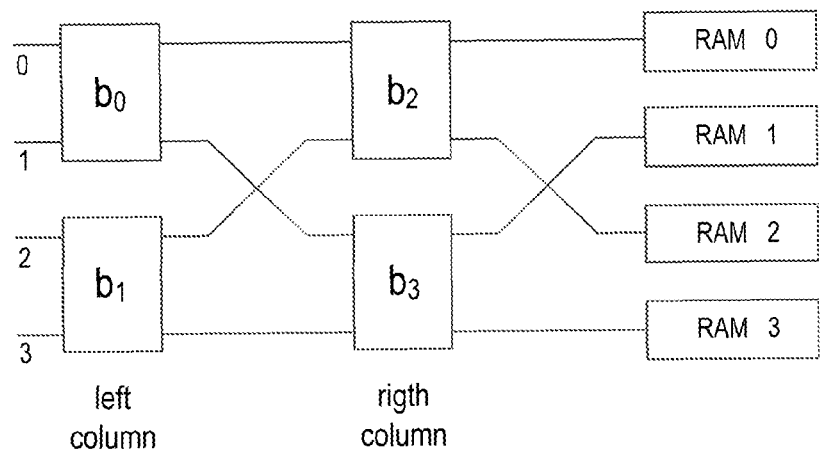
FIG. 2B is similar to FIG. 2A but showing a butterfly network of only four switches and relevant to more specific example embodiments of these teachings which are presented herein.

To illustrate how to derive a reduced turbo interleaver 310 and a reduced inverse turbo interleaver 312 from a turbo interleaver 300 (FIG. 3A) and a multiple access scheme 304, the number of RAM memories is chosen to be equal to four as shown more particularly at FIG. 2B and the length of a turbo interleaver is set to be N=20. In this case the lengths of the four RAMs are 5 because 20/4=5. The turbo interleaver 300 (FIG. 3A) and the inverse turbo interleaver are shown in the second and third columns of Table 1 below, respectively.

TABLE 1

| i | T(i) | $T^{-1}(i)$ |
|---|------|-------------|
| 0 | 7 | 11 |
| 1 | 13 | 17 |
| 2 | 16 | 5 |
| 3 | 10 | 13 |
| 4 | 19 | 6 |
| 5 | 2 | 19 |
| 6 | 4 | 12 |
| 7 | 8 | 0 |
| 8 | 11 | 7 |
| 9 | 14 | 14 |
| 10 | 18 | 3 |
| 11 | 0 | 8 |
| 12 | 6 | 15 |
| 13 | 3 | 1 |
| 14 | 9 | 9 |

TABLE 1-continued

| i | T(i) | T$^{-1}$(i) |
|---|------|-------------|
| 15 | 12 | 16 |
| 16 | 15 | 2 |
| 17 | 1 | 18 |
| 18 | 17 | 10 |
| 19 | 5 | 4 |

In this particular case the multiple access scheme 304 is chosen to have four address functions $a_j(k)$ defined by:

(a$_0$(k), a$_1$(k), a$_2$(k) a$_3$(k))=(2*k, 2*k+1, 18−2*k, 19−2*k)

for k=0, 1, 2, 3, and 4. This multiple access scheme generates logical addresses to the four RAMs in the ascending order as shown in Table 2:

TABLE 2

| k | a$_0$(k) | a$_1$(k) | a$_2$(k) | a$_3$(k) |
|---|------|------|------|------|
| 0 | 0 | 1 | 18 | 19 |
| 1 | 2 | 3 | 16 | 17 |
| 2 | 4 | 5 | 14 | 15 |
| 3 | 6 | 7 | 12 | 13 |
| 4 | 8 | 9 | 10 | 11 |

The corresponding interleaved order 4-tuple access generates logical addresses to the four RAMs by T(a$_0$(k)), T(a$_1$(k)), T(a$_2$(k)), and T(a$_3$(k)) as shown in Table 3:

TABLE 3

| k | T(a$_0$k)) | T(a$_1$(k)) | T(a$_2$k)) | T(a$_3$(k)) |
|---|------|------|------|------|
| 0 | 7 | 13 | 17 | 5 |
| 1 | 16 | 10 | 15 | 1 |
| 2 | 19 | 2 | 9 | 12 |
| 3 | 4 | 8 | 6 | 3 |
| 4 | 11 | 14 | 18 | 0 |

The (reduced) ascending order 4-tuple access scheme is derived from the original ascending order 4-tuple access scheme by replacing a$_j$(k) by (k,j). Then each address consists of a physical address and a bus index as shown in Table 4 below:

TABLE 4

| k | (k,0) | (k,1) | (k,2)) | (k,3) |
|---|-------|-------|--------|-------|
| 0 | (0,0) | (0,1) | (0,2) | (0,3) |
| 1 | (1,0) | (1,1) | (1,2) | (1,3) |
| 2 | (2,0) | (2,1) | (2,2) | (2,3) |
| 3 | (3,0) | (3,1) | (3,2) | (3,3) |
| 4 | (4,0) | (4,1) | (4,2) | (4,3) |

The reduced turbo interleaver R 310 is deduced from the interleaved order 4-tuple access scheme through the relation T(a$_j$(k))=a$_m$(n) and then replacing T(a$_j$(k)) by (n, m) and a$_k$(k) by (k, j). The 2-part address (n, m) is the value R(k, j) of the reduced turbo interleaver R at (k, j). For example, T(a$_3$(1))=T(19−2*1)=T(17)=1 and 1=a$_1$(0). Therefore the value T(a$_3$(1))=1=a$_1$(0) and the value a$_3$(1)=17 are replaced by (0,1) and (1,3) respectively: R(1,3)=(0,1). When this substitution is repeated for all 20 (logical) addresses T(a$_j$(k)), the following reduced turbo interleaver in Table 5 is obtained:

TABLE 5

| k | R(k,0) | R(k,1) | R(k,2) | R(k,3) |
|---|--------|--------|--------|--------|
| 0 | (3,1) | (3,3) | (1,3) | (2,1) |
| 1 | (1,2) | (4,2) | (2,3) | (0,1) |
| 2 | (0,3) | (1,0) | (4,1) | (3,2) |
| 3 | (2,0) | (4,0) | (3,0) | (1,1) |
| 4 | (4,3) | (2,2) | (0,2) | (0,0) |

The reduced inverse turbo interleaver R$^{-1}$ 312 is derived from the reduced turbo interleaver R by the relation: if R(i, j)=(n, m), then R$^{-1}$(n, m)=(i, j). In particular, if R(1,3)=(0,1), then R$^{-1}$(0,1)=(1,3). In this case the reduced inverse turbo interleaver R$^{-1}$ has 2-diemsional elements as shown in Table 6 below:

TABLE 6

| k | R$^{-1}$(k,0) | R$^{-1}$(k,1) | R$^{-1}$(k,2) | R$^{-1}$(k,3) |
|---|--------|--------|--------|--------|
| 0 | (4,3) | (1,3) | (4,2) | (2,0) |
| 1 | (2,1) | (3,3) | (1,0) | (0,2) |
| 2 | (3,0) | (0,3) | (4,1) | (1,2) |
| 3 | (3,2) | (0,0) | (2,3) | (0,1) |
| 4 | (3,1) | (2,2) | (1,1) | (4,0) |

Nevertheless, one cannot use 2-part addresses of Table 4 and Table 5 to access the four RAMs. Control bits of a 4-tuple butterfly network shown at FIG. 2B to route data and addresses are not known yet. They are needed to navigate through the 4-tuple butterfly network.

The original turbo interleaver T and its inverse interleaver T$^{-1}$ satisfy the two equations: T(T$^{-1}$(j))=j and T$^{-1}$(T(j))=j for j=0,1,2, ..., N−1. The reduced turbo interleaver R and the reduced inverse turbo interleaver R$^{-1}$ satisfy similar two equations: R(R$^{-1}$(n, m))=(n, m) and R$^{-1}$(R(n, m))=(n, m) for n=0,1,2, ..., N/2$^y$−1 and for m=0,1,2, ..., 2$^y$ ... 1. As in the case of the original turbo interleaver and the de-interleaver in U.S. Pat. No. 8,051,239, col 6, lines 17-27, the reduced turbo interleaver and the reduced de-interleaver can be utilised to move back and forth between a linear order address space and an interleaved order address space, now a (reduced) rule to move from a linear order address space to an interleaved address space stems from (k$_{addr1}$, k$_{bus1}$)=R(R$^{-1}$(k$_{addr1}$, k$_{bus1}$))=R(k$_{addr2}$, k$_{bus2}$) with (k$_{addr2}$, k$_{bus2}$)=R$^{-1}$(k$_{addr1}$, k$_{bus1}$). Then it follows that the reduced de-interleaver determines the rule to move from a linear order address space to an interleaved order address space. A (reduced) rule to move from an interleaved order address space to a linear order address space is R(k$_{addrs3}$, k$_{bus3}$)=(k$_{addr4}$, k$_{bus4}$). In other words, the reduced interleaver determines the rule to move from an interleaved order address space to a linear order address space. Use of a reduced interleaver and a reduced de-interleaver simplifies moving back and forth between the two address spaces because a multiple access scheme and a bus structure of a butterfly network are taken into account in the 2-part address format as explained above.

The above approach reduces all multiple access schemes to a single access scheme: an address to a RAM memory 206 has two components, namely one component telling an actual (physical) address of a RAM memory space 206 (RAM 0 through RAM 7) and a second one telling an index of a bus 203. Representing RAM memory space addresses in this two-part manner with a reduced turbo interleaver is useful when solving control bits of a butterfly network 204 for turbo codes. Each j$^{th}$ bus at 203 identifies the physical address spaces shown in FIG. 2A as RAM0 through RAM7. The physical address spaces cannot be applied to the memory spaces 206 (RAM0 through RAM7) without knowing twelve control bits $b_0, b_1, \ldots, b_{10}$, and $b_{11}$ of the butterfly network 204. However, the physical address spaces with bus indexes can be utilised at 203 for solving control bits and finding routing paths through the butterfly network 204. The physical address spaces of the RAM 206 can be used with the turbo decoder 202 only if control bits of the butterfly network 204 for both access orders are known. As noted above it has much wider applications for any iterative algorithm which stores and/or retrieves data from discrete memory spaces 206 which are accessed by any one of multiple possible busses.

Once 12-bit wide control signals 320, 322 are available for both the ascending order 8-tuple access and the interleaver order, 8-tuple access bus indexes can be removed from the 2-part RAM addresses. The 12-bit wide control signals of the butterfly network for the ascending order 8-tuple access are denoted by the bit vectors ($b_{0;k}$, $b_{1;k}$, $b_{2;k}$, $b_{3;k}$, $b_{4;k}$, $b_{5;k}$, $b_{6;k}$, $b_{7;k}$, $b_{8;k}$, $b_{9;k}$, $b_{10;k}$, $b_{11;k}$). The complete ascending order 8-tuple access is then a vector of data values with physical address vectors for the RAM 206

(k, k, k, k, k, k, k, k)

and with butterfly network control bits ($b_{0;k}$, $b_{1;k}$, $b_{2;k}$, $b_{3;k}$, $b_{4;k}$, $b_{5;k}$, $b_{6;k}$, $b_{7;k}$, $b_{8;k}$, $b_{9;k}$, $b_{10;k}$, $b_{11;k}$)

for $k=0,1,2,\ldots,N/8-1$.

Denote control bit vectors of the butterfly network to the interleaved order 8-tuple access by ($\beta_{0;k}$, $\beta_{1;k}$, $\beta_{2;k}$, $\beta_{3;k}$, $\beta_{4;k}$, $\beta_{5;k}$, $\beta_{6;k}$, $\beta_{7;k}$, $\beta_{8;k}$, $\beta_{9;k}$, $\beta_{10;k}$, $\beta_{11;k}$). The complete interleaver order 8-triple access is a vector of data values with physical address vectors in the RAM 206

($n_{k;0}$, $n_{k;1}$, $n_{k;2}$, $n_{k;3}$, $n_{k;4}$, $n_{k;5}$, $n_{k;6}$, $n_{k;7}$)

and with butterfly network control bits

62 $_{0;k}$, $\beta_{1;k}$, $\beta_{2;k}$, $\beta_{3;k}$, $\beta_{4;k}$, $\beta_{5;k}$, $\beta_{6;k}$, $\beta_{7;k}$, $\beta_{8;k}$, $\beta_{9;k}$, $\beta_{10;k}$, $\beta_{11;k}$) for $k=0,1,2,\ldots,N/8-1$ and where $n_{k;j}$ are as described above. The 8-tuple physical address vectors ($n_{k;0}$, $n_{k;1}$, $n_{k;2}$, $n_{k;3}$, $n_{k;4}$, $n_{k;5}$, $n_{k;6}$, $n_{k;7}$) in the RAM 206 shall be permuted by an 8-tuple butterfly network from left to right in FIG. 2A. Permuted 8-tuple physical address vectors can be used repeatedly if they are saved as permuted.

As a general principle, the 8-tuple mirror access scheme (ascending and interleaved accesses) is already used commercially. As such the more particular computer-program implementations below are for such an 8-tuple mirror access, though they can readily be adapted to mirror access of any $2^y$ tuple, where y is any positive integer. In these examples, the eight data values to be written to the eight RAM address spaces 206 consist of a pair of four data values such that two sets of the four values are taken symmetrically with respect to the midpoint N/2 of a data frame. In other words, for $k=0,1, 2, \ldots, N/8-1$ the RAM address functions are:

$a_j(k)=4*k+j$, for $j=0, 1, 2$, and 3;

and $a_j(k)=N-4*k+j-8$, for $j=4, 5, 6$, and 7.

There are turbo codes whose turbo interleavers may not have lengths that are integer multiples of a degree $2^y$ of a multiple access scheme. The turbo codes can be extended by adding extra predefined soft bits into code words and extra addresses to turbo interleavers. The techniques are presented in detail at U.S. Pat. No. 7,839,310. Then a reduced turbo interleaver is deduced from the extended turbo interleaver as explained above.

The approach of solving control bits of butterfly networks directly can take advantage of reduced multiple access schemes and reduced turbo interleavers simultaneously. Then the two parts of embodiments of the invention mentioned above provide maximal benefits for implementing parallel data access turbo decoders. To this end, an exemplary description illustrates how to use 8-tuple butterfly networks together according to these teachings.

Figure 8:
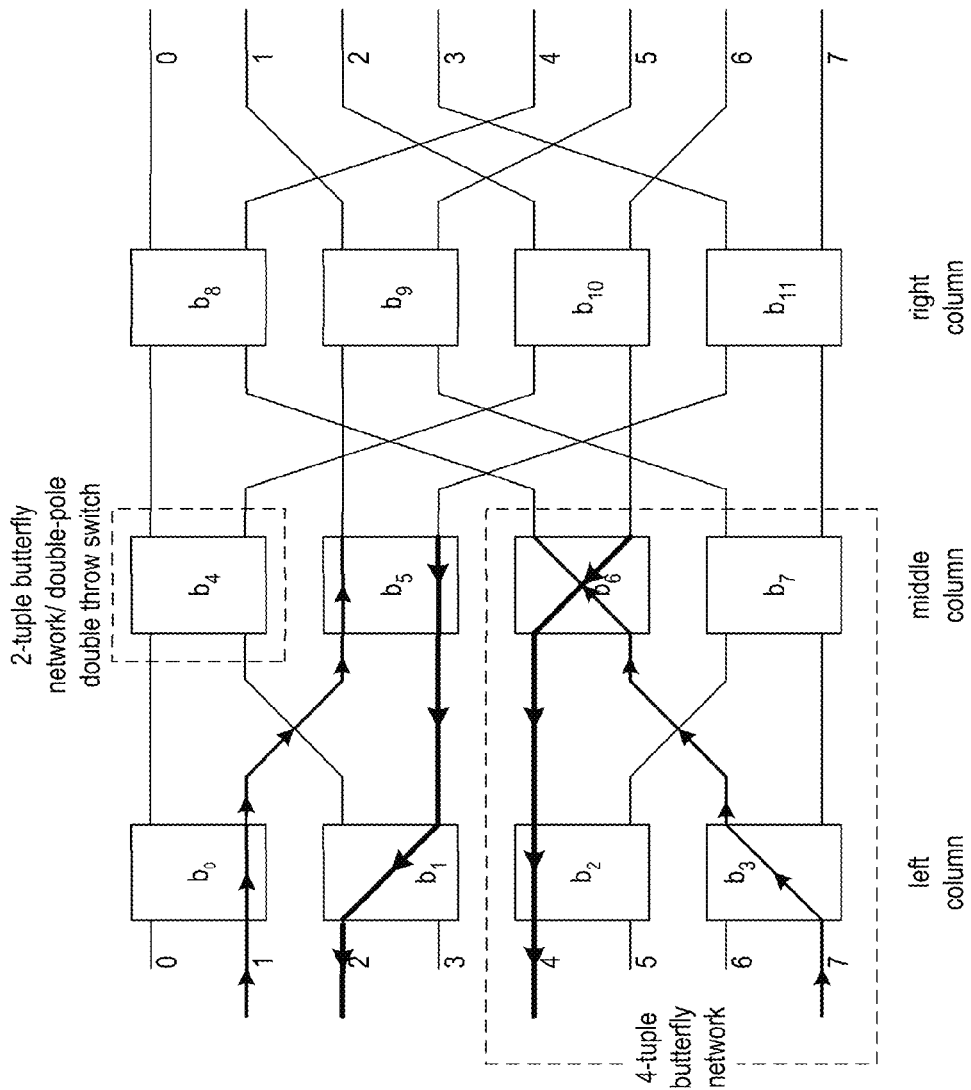

Twelve control bits of 8-tuple butterfly networks are solved by growing a size of butterfly networks. The sizes are 2, 4, and 8 in terms of input and output buses (or input/output pins). Butterfly networks have a hierarchical structure such that a next size butterfly network can be built by two butterfly networks of a current size. FIG. 8 illustrates how two 4-tuple butterfly networks are sub-networks of an 8-tuple butterfly network. Two-tuple butterfly networks (also known as double-pole double throw switches or cross-bar switches) are basic structural blocks of butterfly networks.

A (reduced) parallel access scheme and a (reduced) turbo interleaver determine a set of graphs of nodes. A node of a graph is a 2-, 4-, or 8-tuple network depending on in which columns of FIG. 2A four control bits to be solved are. A number of nodes in a graph can take values from 2 to N, where N is a length of a reduced (extended if needed) turbo interleaver and is even. A sum of nodes in graphs is equal to N. A number of graphs can vary from 1 to N/2. Graphs are disjoint closed loops (or rings) of nodes. The algorithm to solve control bits processes graphs one-by-one by searching for an entry node to each graph. Processing of graphs begins with graphs of 2-tuple butterfly networks (in left columns 204a of FIG. 2A), next graphs of 4-tuple butterfly networks are done (middle columns 204b of FIG. 2A), and finally graphs of 8-tuple butterfly networks (right columns 204c of FIG. 2A). A size of nodes is increased to a next size when all graphs of the current size have been processed.

Figure 4:
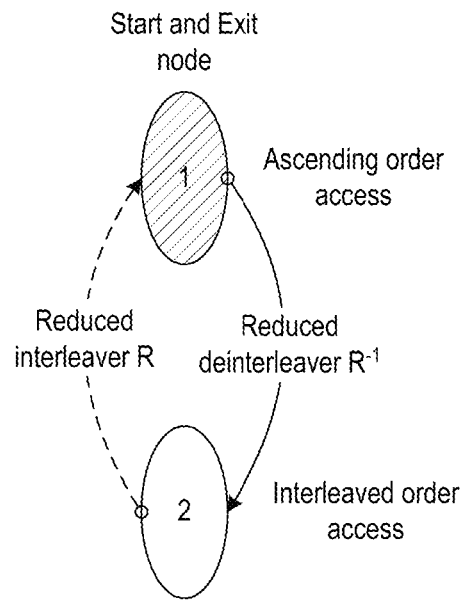
FIGS. 4 to 6 show schematically two, four and eight nodes respectively between a reduced turbo interleaver and its inverse and illustrate specific examples of how control nodes for a butterfly network are solved according to exemplary embodiments of these teachings.

FIG. 4 illustrates a graph of two nodes. The two nodes are connected by a reduced turbo interleaver and its inverse (called de-interleaver as well). In general half of the nodes belong to ascending order access nodes and the other half to interleaver order access nodes. At each node, one control bit is solved. Processing of ascending order access nodes solves control bits for ascending order access and that of interleaver order access nodes does control bits for interleaved order access. The process to solve bits assigns bits on the two types of nodes in turn one after another along a graph until the process to solve bits returns to a start node.

Figure 5:
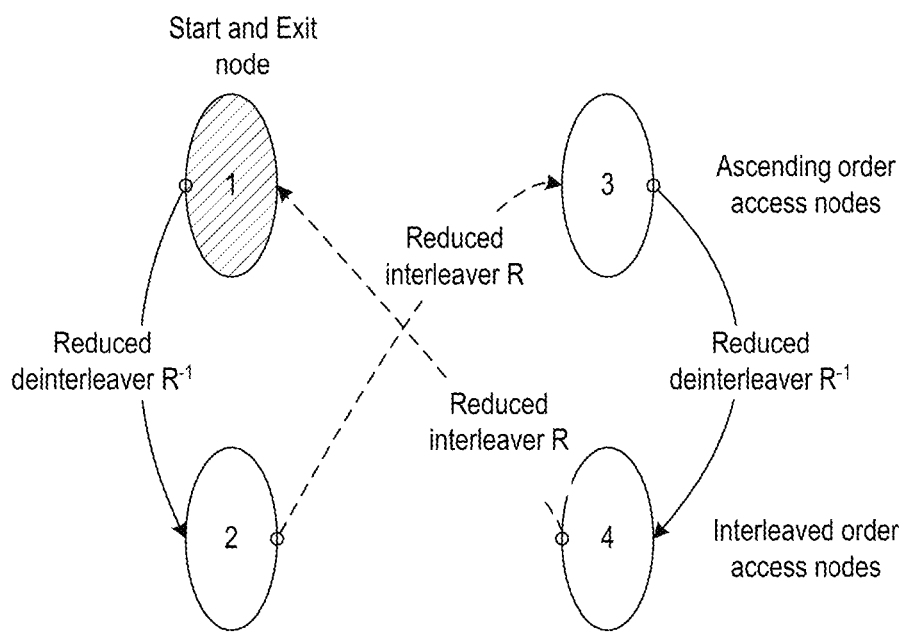
Figure 6:
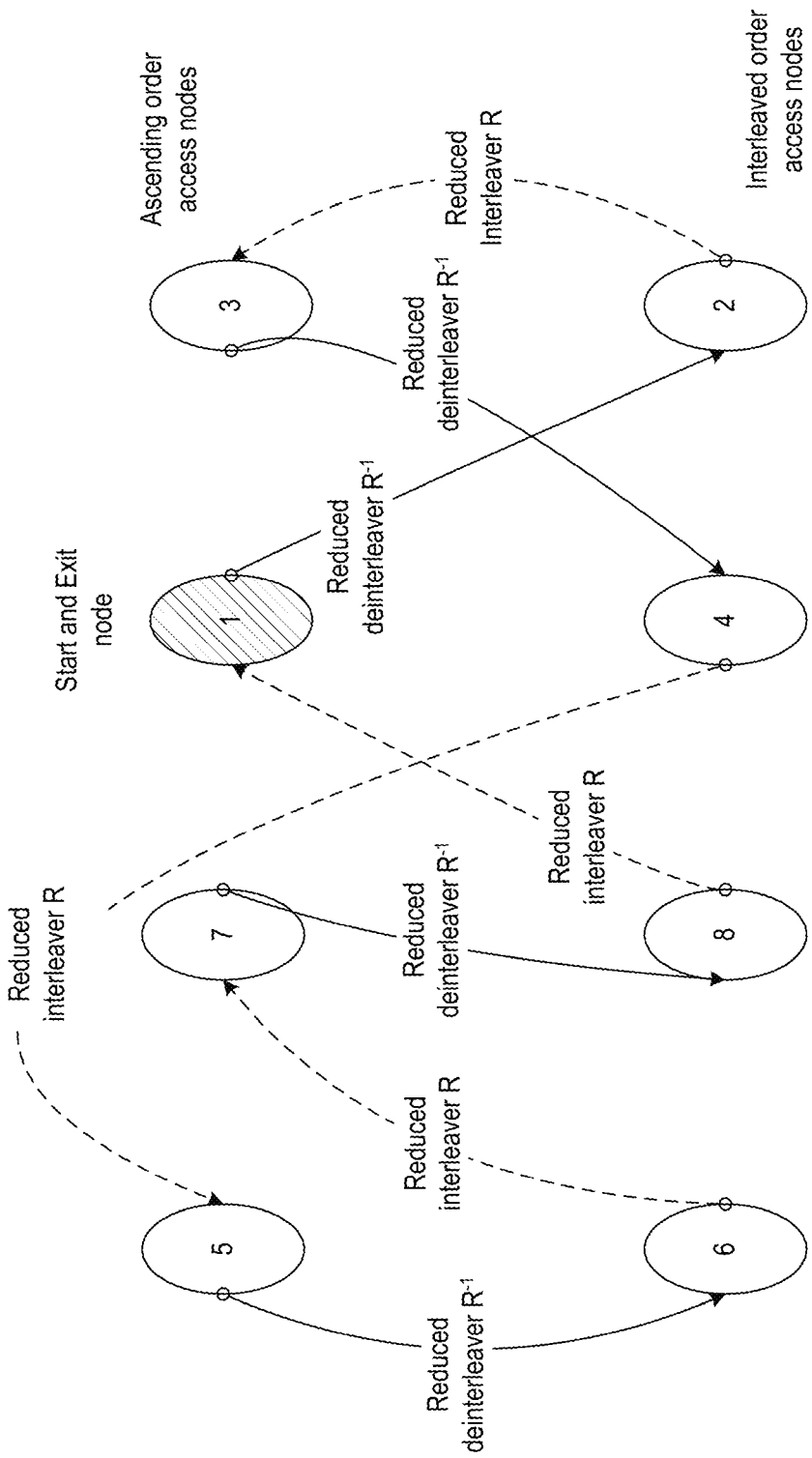

FIG. 5 depicts a graph of four nodes and FIG. 6 shows a graph of eight nodes. Solid line arrows mean that the process to solve bits uses a reduced de-interleaver $R^{-1}$ to move to a next node in a graph. Dashed line arrows mean that the process to solve bits applies a reduced interleaver R to get to a next node in a graph. Nodes are not at consecutive memory addresses but in random addresses which are determined by a reduced turbo interleaver and a parallel access scheme. Numbers in nodes illustrate a processing order of nodes.

Figure 7:
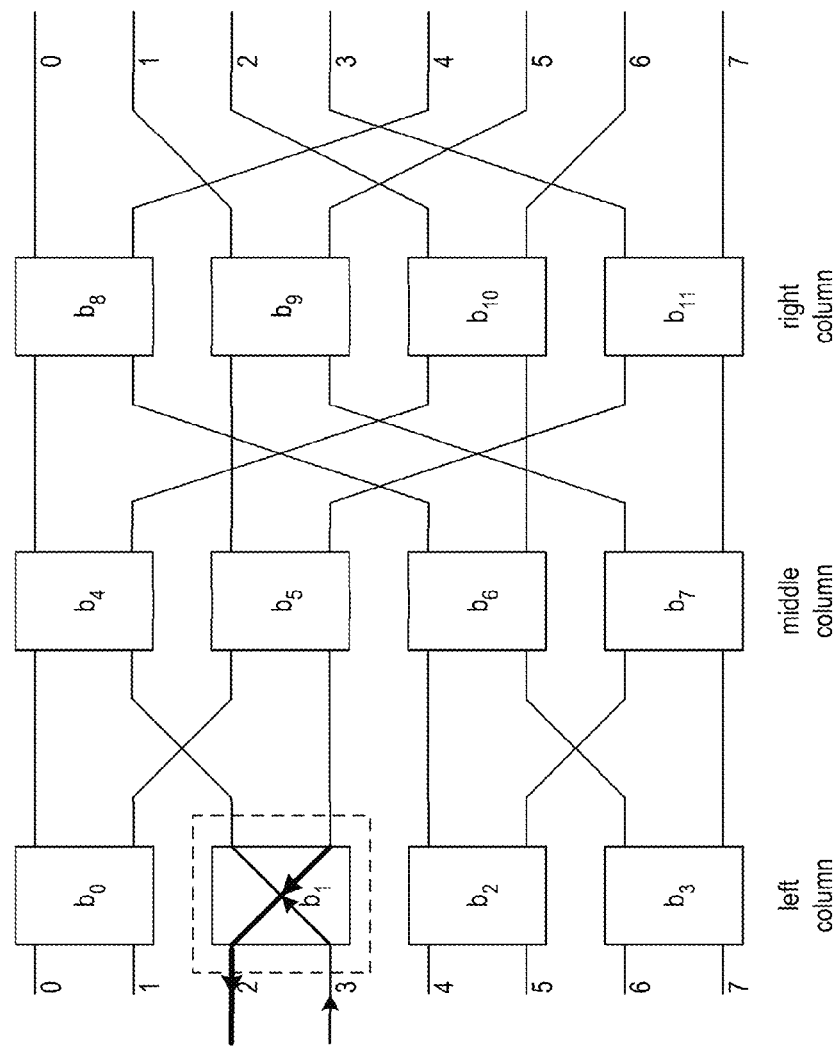
FIGS. 7 to 9 show schematically an example of a butterfly network having control bits solved corresponding to the two, four and eight nodes shown at respective FIGS. 4-6 according to exemplary embodiments of these teachings.

The process to solve 12-control bits of 8-tuple butterfly network in this example begins with solving four least significant bits $b_0$, $b_1$, $b_2$, and $b_3$ in left columns of butterfly networks shown in FIG. 2A-B and FIG. 7. This is equivalent to solving of 2-dimensional access contentions. Four bookkeeping bits per column are used to make sure that each sub 2-tuple butterfly network is processed only once. The process to solve the four least significant bits has two basic functions, namely detecting of free graphs and processing of detected graphs one-by-one. Entry nodes to graphs are searched for ascending order nodes. Any ascending order node of a graph can be an entry node. Four bookkeeping bits per left column show if a left column has an entry node to a graph. A number of entry nodes per left column can be 0, 1, 2, 3, or 4 for 8-tuple butterfly networks; FIG. 7. If four bookkeeping bits indicate that there is no entry node to a graph, then a left column of a next 8-tuple butterfly network is taken to check out. If a graph of unassigned nodes is detected, the process to solve bits starts to assign values to control bits in left columns. FIG. 7 shows as the process to solve bits enters on the bus 3 to a 2-tuple butterfly network (left-to-right arrows). The bit $b_1$ is set to 1 to maintain cross connection. The process to solve bits exits from the 2-tuple butterfly network on the bus 2 (right-to-left arrows). At the same time, the bookkeeping bit of this node is set to 1 to prevent double processing of the node. The process to solve bits sweeps over a graph until it arrives at the start node as shown in FIGS. 4, 5 and 6, Solving four bits $b_4$, $b_5$, $b_6$, and $b_7$ in middle columns of 8-tuple butterfly networks is similar to solving four bits $b_0$, $b_1$, $b_2$, and $b_3$ in left columns. In this step, nodes of a graph are 4-tuple butterfly networks as shown at FIG. 8. This step is equivalent to solving 4-dimensional access contentions. Four bits in left columns must be known before assigning values to four bits in middle columns as in FIG. 8. The process to solve bits enters to 8-tuple butterfly networks on one of the buses in left columns at a time. For example, the process enters along the bus 7 to the 8-tuple butterfly network in FIG. 8. The index of a 2-tuple butterfly network in middle columns whose control bit is going to be assigned is known. Therefore the process to solve bits can jump directly from an entry bus to the 2-tuple butterfly network in middle columns without using control bits in left columns. Left-to-right arrows in FIG. 8 illustrate this step for two entry buses 1 and 7. Nevertheless, one of the two can be active at a time. The bus index of an entry bus determines how to set a bit for a 2-tuple butterfly network in middle columns. After setting the bit in middle columns, the process to solve bits returns from the middle column 2-tuple butterfly network to another bus in left columns along path which is connected to a pair pin of the middle column 2-tuple butterfly network. In this phase, a control bit in left columns is required to move through one 2-tuple butterfly network in left columns. Two right-to-left arrows in FIG. 8 illustrate this action.

For example, the index of a middle column 2-tuple butterfly network is two and the process to solve bits enters into an 8-tuple butterfly network at the bus seven in left columns in FIG. 8. The middle column 2-tuple butterfly network number two has the control bit $b_6$. The bit $b_6$ is set to 1 because the second least significant bit of the entering bus index is 1 ($7_{DEC}=111_{BIN}$). Then the process to solve bits exits from the middle column butterfly network on the path indicated by the right-to-left arrow over the 4-tuple sub-butterfly network as in FIG. 8. The exit bus index is four and this bus number is needed to get a next address to access the reduced de-interleaver.

Figure 9:
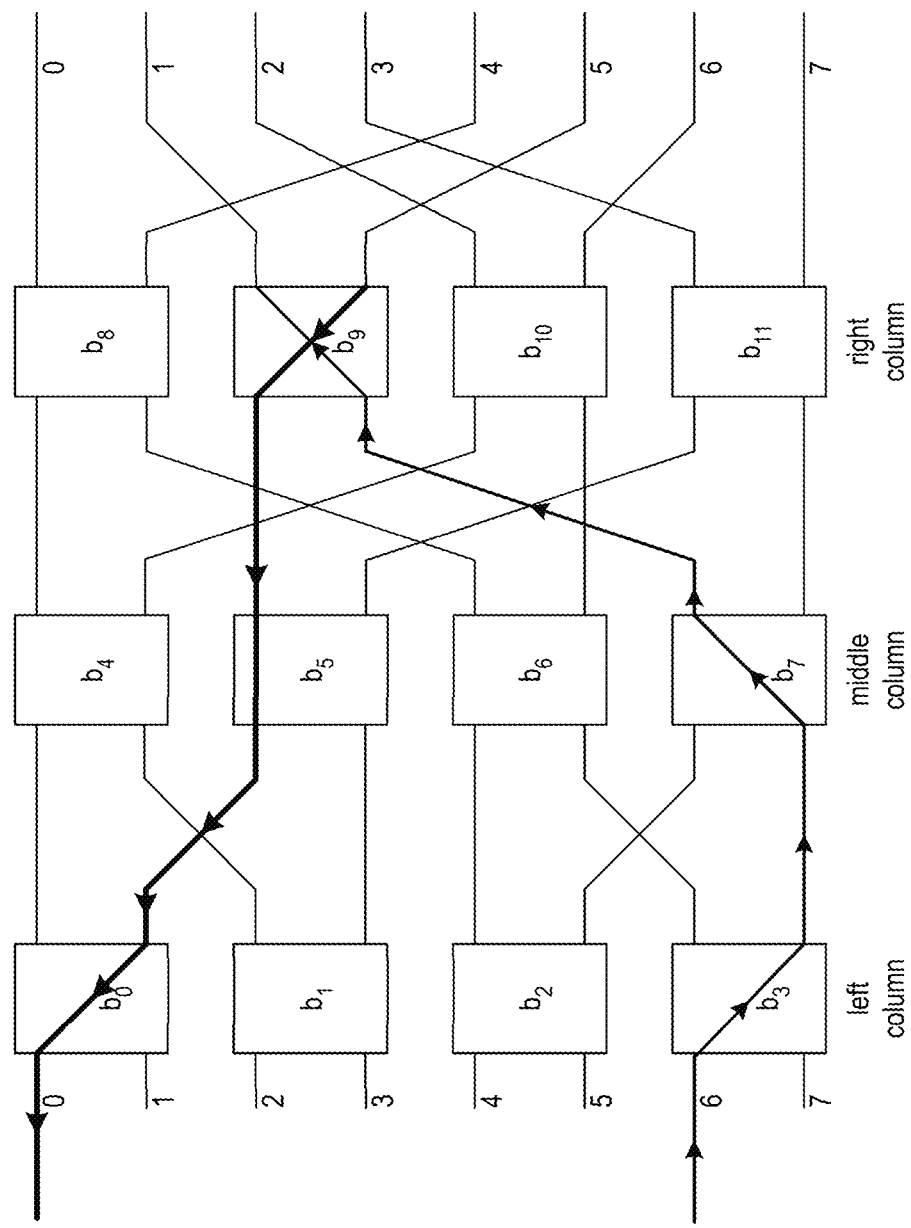

Solving 8-dimensional access contentions differs from solving 2- and 4-dimensional access contentions by bigger butterfly networks. At this point eight least significant control bits of 8-tuple butterfly networks are known and remaining four most significant bits are being solved. The four bits are in right columns of 8-tuple butterfly networks; FIG. 9. The process to solve bits searches for indexes of 2-tuple butterfly networks whose control bits are not assigned in right columns; FIG. 9. Once such an entry index is detected, the process to solve bits starts to sweep through a graph of nodes by assigning values to control bits sitting at that particular bit index. The bit index is same for all 8-tuple butterfly networks belonging to the same graph. Likewise in solving control bits in middle columns, the process to solve bits enters into an 8-tuple butterfly network at one of buses in left columns, for example, at the bus six in FIG. 9, and exits from the 8-tuple butterfly network on other bus in left columns, the bus zero in FIG. 9. An entry bus and an exit bus cannot be in a same half of an 8-tuple butterfly network. In other words, if an entry bus has an index value in 0, 1, 2, and 3, then an exit bus index has to be one of 4, 5, 6, and 7; and vice versa.

The process to solve bits enters to a node at the bus six in FIG. 9. The 2-tuple butterfly network whose control bit is going to be assigned has the index 1 in the right column in FIG. 9. The corresponding control bit is $b_9$. The process to solve bits sets the bit $b_9=1$ because the $3^{rd}$ bit of the entry bus index is 1 ($6_{DEC} 110_{BIN}$). The control bits $b_3$ and $b_7$ in the red arrow path in FIG. 9 are not needed because the index of the 2-tuple butterfly network of the control bits $b_9$ is known: it is 1. An index of an exit bus in the green arrow path in FIG. 9 is unknown. The index of an exit bus can be calculated from the control bits $b_9=1$, $b_5=0$, $b_0=1$ and the entry bus index 6. In this case the exit bus index is 0 as FIG. 9 illustrates. Then the process to solve bits applies the exit bus index to the de-interleaver to move to an interleaved order access node. The process to solve bits has done all nodes of a graph when it returns to the start node again.

Solving control bits in middle and right columns involve also detecting of entry nodes to graphs not being swept through. Bookkeeping bits of middle (and left) columns are updated when assigning values for bits in ascending order nodes to prevent from processing nodes multiple times. Setting each bit once is enough to get all bits solved.

A reduced turbo interleaver and de-interleaver can be applied to move efficiently between ascending and interleaver order nodes shown in FIGS. 4, 5 and 6. Assume that a detected entry node has an address $k_1$ with a bus index $k_{bus;1}$ in the reduced address format. Then one control bit of the $k_1$:th ascending order access butterfly network is assigned and an exit bus index $k_{exit;1}$ is computed as explained above and illustrated in FIGS. 8, 9 and 10 for the entry node. The address of a next interleaved order access node (or butterfly network) is obtained by:

$(k_2; k_{bus;2})=R^{-1}(k_1, k_{exit;1})$.

The address $k_2$ corresponds to the $k_2$:th interleaved order butterfly network. The bus index $k_{bus;2}$ identifies an entry bus to the $k_2$:th butterfly network. The bit in question is assigned and a next exit bus index $k_{exit;2}$ is obtained as said above. The address of a next ascending order node is determined by:

$(k_3; k_{bus;3})=R(k_2, k_{exit;2})$

The bus index $k_{bus;3}$ shows an entry bus index to the $k_3$:th ascending order butterfly network. Again one control bit of a butterfly network is solved and a next exit bus index calculated. These operations are repeated until the ascending order access address $k_n$ is equal to the entry node address $k_1$ and the bus index $k_{bus;n}$ points to the same 2-tuple butterfly network as the entry node bus index $k_{bus;1}$ does.

FIG. 3B shows the high level steps on solving of control bits of a butterfly network by a reduced interleaver 310 and a reduced de-interleaver 312. To illustrate the solving process in detail, the same multiple scheme to four RAMs as in FIG. 2B is considered as in Table 1 and the related discussion above. The reduced turbo interleaver R is as in Table 5 and the reduced turbo interleaver $R^{-1}$ as in Table 6. The four RAMs require a 4-tupe butterfly network to route data values to and from the four RAMs. Each access of four parallel data values requires four bits to control the 4-tuple butterfly network to route the data. Five 4-bit vectors ($b_{0;k}$, $b_{1;k}$, $b_{2;k}$, $b_{3;k}$), k=0, 1, 2, 3, 4, are control bits of the ascending order multiple access and other five 4-bit vectors ($\beta_{0;k}$, $\beta_{1;k}$, $\beta_{2;k}$, $\beta_{3;k}$), k=0, 1, 2, 3, 4, are control bits of the interleaver order multiple access. The 4-tuple butterfly network has two columns of 2-tuple butterfly networks. Both columns consist of two 2-tuple butterfly networks. There two bookkeeping bits per column is enough to make sure that every control bit is solved only once. The bookkeeping bits are denoted by 2-bit vectors ($c_{0;k}$, $c_{1;k}$) for k=0, 1, 2, 3, and 4. The initial values of the bookkeeping bits are assumed to be 0 (zero).

An exemplary algorithm in terms of a pseudo code is discussed with respect to solving 314 two least significant control bits of 4-tuple butterfly networks. Bits in questions control left columns of 4-tuple butterfly networks in FIG. 2B. The two outermost For-loops are responsible for detecting entry nodes to free graphs, that is, 2-tuple butterfly networks of first columns whose control bits are not solved. The Do-While-loop runs through nodes of a graph by assigning values control bits of the ascending order access and the interleaver order access in turns. In this particular case, because the reduced interleaver R 310 is as in Table 5 and its inverse $R^{-1}$ 312 is as in Table 6, there is only one graph of 20 nodes. Hence the two outermost For-loops detect only one entry node to a graph of nodes, counter=0;
For i=0; i<5; Do
  For p=0; p<2 Do
    If($c_{p;i}$=0) Then
      $k_{1st}$=i;
      $k_{1stbus}$=2*p;
      k=$k_{1st}$;
      $k_{bus}$=$k_{1stbus}$;
      Do
**
** solving ascending order bits
**
      n=$k_{bus}$/2; ** an index to a bit
      $b_{n;k}$=a least significant bit of $k_{bus}$;
      $c_{n;k}$=1; ** this 2-tuple butterfly network done
      If($k_{bus}$ is even) Than ** choosing an exit bus index
        $k_{exit}$=$k_{bus}$+1;
      Else
        $k_{exit}$=$k_{bus}$−1;
      EndIf
      (k,$k_{bus}$)=$R^{-1}$(k,$k_{exit}$);
      counter=counter+1;
**
** solving interleaver order bits:
**

```
          If($k_{bus}$ is even) Then ** choosing an exit bus index
              $k_{exit}$ = $k_{bus}$ + 1;
          Else
              $k_{exit}$ = $k_{bus}$ − 1;
          EndIf
          n = $k_{exit}$/2; ** an index to a bit
          $β_{n,k}$ = a least significant bit of $k_{exit}$;
          (k,$k_{bus}$) = R(k,$k_{exit}$);
          counter = counter + 1;
        While(($k_{1st}$ ≠ k) OR ($k_{1stbus}$ ≠ $k_{bus}$));
        If(counter = 20) Stop to execute the algorithm
      EndIf
      p = p + 1;
    EndFor
    i = i + 1;
EndFor
```

Table 7 shows step-by-step values of variables of the pseudo code when it is executed with R 310 as in Table 5 and $R^{-1}$ 312 as in Table 6. Even numbered rows represent values of variables for the ascending order access and odd numbered rows represents values of variables for the interleaved order access. The bookkeeping bits are set to 1 on the even numbered rows and they are not shown in Table 7.

TABLE 7

| Counter | In address (k, $k_{bus}$) | Assigned control bit | Next in address (k, $k_{bus}$) from R or $R^{-1}$ at (k, $k_{exit}$) |
|---|---|---|---|
| 0 | (0,0) | $b_{0;0}$ = 0 | (1,3) = $R^{-1}$(0,1) |
| 1 | (1,3) | $β_{1,1}$ = 0 | (2,3) = R(1,2) |
| 2 | (2,3) | $b_{1;2}$ = 1 | (4,1) = $R^{-1}$(2,2) |
| 3 | (4,1) | $β_{0;4}$ = 0 | (4,3) = R(4,0) |
| 4 | (4,3) | $b_{1;4}$ = 1 | (1,1) = $R^{-1}$(4,2) |
| 5 | (1,1) | $β_{0;1}$ = 0 | (1,2) = R(1,0) |
| 6 | (1,2) | $b_{1;1}$ = 0 | (0,2) = $R^{-1}$(1,3) |
| 7 | (0,2) | $β_{1;0}$ = 1 | (2,1) = R(0,3) |
| 8 | (2,1) | $b_{0;2}$ = 1 | (3,0) = $R^{-1}$(2,0) |
| 9 | (3,0) | $β_{0;3}$ = 1 | (4,0) = R(3,1) |
| 10 | (4,0) | $b_{0;4}$ = 0 | (2,2) = $R^{-1}$(4,1) |
| 11 | (2,2) | $β_{1;2}$ = 1 | (3,2) = R(2,3) |
| 12 | (3,2) | $b_{1;3}$ = 0 | (0,1) = $R^{-1}$(3,3) |
| 13 | (0,1) | $β_{0;0}$ = 0 | (3,1) = R(0,0) |
| 14 | (3,1) | $b_{0;3}$ = 1 | (3,2) = $R^{-1}$(3,0) |
| 15 | (3,2) | $β_{1;3}$ = 1 | (1,1) = R(3,3) |
| 16 | (1,1) | $b_{0;1}$ = 1 | (2,1) = $R^{-1}$(1,0) |
| 17 | (2,1) | $β_{0;2}$ = 0 | (0,3) = R(2,0) |
| 18 | (0,3) | $b_{1;0}$ = 1 | (4,2) = $R^{-1}$(0,2) |
| 19 | (4,2) | $β_{1;4}$ = 1 | (0,0) = R(4,3) |

Two least significant control bits out of four per access have been solved. Values of two most significant control bits per access are still unknown. Current values of control bits 320, 322 of the ascending order 4-tuple access and of the interleaved 4-tuple access are listed in Table 8.

TABLE 8

| | Ascending order bits | | | | Interleaved order bits | | | |
|---|---|---|---|---|---|---|---|---|
| k | $b_{0,k}$ | $b_{1,k}$ | $b_{2,k}$ | $b_{3,k}$ | $β_{0;k}$ | $β_{1;k}$ | $β_{2;k}$ | $β_{3;k}$ |
| 0 | 0 | 1 | — | — | 0 | 1 | — | — |
| 1 | 1 | 0 | — | — | 0 | 0 | — | — |
| 2 | 1 | 1 | — | — | 0 | 1 | — | — |
| 3 | 1 | 0 | — | — | 0 | 1 | — | — |

Another exemplary algorithm in terms of a pseudo code is discussed with regard to solving 314 two most significant control bits of the 4-tuple butterfly network. These bits are in right columns of the 4-tuple butterfly network in FIG. 2B. Solving of bits in second columns differs from solving bits in first columns. The algorithm takes advantage of bits in first columns when solving bits in second columns. Values of the exit bus index $k_{exit}$ are calculated from $2^{nd}$ least significant bit of the bus index $k_{bus}$. The initial values of the bookkeeping bits are assumed to be 0 (zero).

counter=0;
For i=0; i<5; Do
  For p=0; p<2 Do
    If($c_{p;i}$=0) Then
      $k_{1st}$=i;
      $k_{1stbus}$=p; ** same as a bit index in the $2^{nd}$ column
      k=$k_{1st}$;
      $k_{bus}$=$k_{1stbus}$;
      Do
**
** solving ascending order bits
**
      n=2+p; ** an index to a bit
      $k_{bus2nd}$=a $2^{nd}$ least significant bit of $k_{bus}$;
      $b_{n;k}$=$k_{bus2nd}$;
      $c_{p;k}$=1; ** this 2-tuple butterfly network done
      If($k_{bus2nd}$=0) Then ** choosing an exit bus index
        $k_{exit}$2+($b_{1;k}$ XOR p); ** exit bus 2 or 3

Else
    $k_{exit} = (b_{0;k}$ XOR p); ** exit bus 0 or 1
EndIf
$(k, k_{bus}) = R^{-1}(k, k_{exit})$;
counter = counter + 1;
**
** solving interleaver order bits:
**

```
n = 2 + p; ** an index to a bit
k_bus2nd = a 2^nd least significant bit of k_bus;
β_n;k = NOT(k_bus2nd); ** inverting a bit, 0>1, 1<0
If(k_bus2nd = 0) Then ** choosing an exit bus index
    k_exit = 2 + (β_1;k XOR p); ** exit bus 2 or 3
Else
    k_exit = (β_0;k XOR p): ** exit bus 0 or 1
EndIf
(k, k_bus) = R(k, k_exit);
counter = counter + 1;
While((k_1st ≠ k) OR (k_1stbus ≠ k_bus));
    If(counter = 20) Stop to execute the algorithm
EndIf
p = p + 1;
EndFor
i = i + 1;
EndFor
```

By taking the reduced turbo interleaver R 310 from Table 5, its inverse 312 from Table 6, and control bits of first columns 320, 322 from Table 8 to be input to the pseudo code algorithm presented in the first exemplary algorithm above presented prior to Table 7, one gets step-by-step values of variables of the algorithm as shown in Table 9 and Table 10. In this case the two outermost For-loops detect two entry nodes to graphs of nodes. Both graphs have ten nodes. Table 9 shows values of variables of the algorithm when solving control bits of upper 2-tuple butterfly networks in second columns.

TABLE 9

| Counter | In address $(k, k_{bus})$ | Assigned control bit | Next in address $(k, k_{bus})$ from R or $R^{-1}$ at $(k, k_{exit})$ |
|---|---|---|---|
| 0 | (0,0) | $b_{2;0} = 0$ | $(2,0) = R^{-1}(0,3)$ |
| 1 | (2,0) | $\beta_{2;2} = 1$ | $(3,2) = R(2,3)$ |
| 2 | (3,2) | $b_{2;3} = 1$ | $(0,0) = R^{-1}(3,1)$ |
| 3 | (0,0) | $\beta_{2;0} = 1$ | $(2,1) = R(0,3)$ |
| 4 | (2,1) | $b_{2;2} = 0$ | $(1,2) = R^{-1}(2,3)$ |
| 5 | (1,2) | $\beta_{2;1} = 0$ | $(1,2) = R(1,0)$ |
| 6 | (1,2) | $b_{2;1} = 1$ | $(3,3) = R^{-1}(1,1)$ |
| 7 | (3,3) | $\beta_{2;3} = 0$ | $(4,0) = R(3,1)$ |
| 8 | (4,0) | $b_{2;4} = 0$ | $(4,0) = R^{-1}(4,3)$ |
| 9 | (4,0) | $\beta_{2;4} = 1$ | $(0,0) = R(4,3)$ |

Table 10 shows values of variables of the algorithm when solving control bits of lower 2-tuple butterfly networks in second columns.

TABLE 10

| Counter | In address $(k, k_{bus})$ | Assigned control bit | Next in address $(k, k_{bus})$ from R or $R^{-1}$ at $(k, k_{exit})$ |
|---|---|---|---|
| 10 | (0,1) | $b_{3;0} = 0$ | $(4,2) = R^{-1}(0,2)$ |
| 11 | (4,2) | $\beta_{3;4} = 0$ | $(2,2) = R(4,1)$ |
| 12 | (2,2) | $b_{3;2} = 1$ | $(3,0) = R^{-1}(2,0)$ |
| 13 | (3,0) | $\beta_{3;3} = 1$ | $(3,0) = R(3,2)$ |
| 14 | (3,0) | $b_{3;3} = 0$ | $(0,1) = R^{-1}(3,3)$ |
| 15 | (0,1) | $\beta_{3;0} = 1$ | $(1,3) = R(0,2)$ |
| 16 | (1,3) | $b_{3;1} = 1$ | $(2,1) = R^{-1}(1,0)$ |

TABLE 10-continued

| Counter | In address $(k, k_{bus})$ | Assigned control bit | Next in address $(k, k_{bus})$ from R or $R^{-1}$ at $(k, k_{exit})$ |
|---|---|---|---|
| 17 | (2,1) | $\beta_{3;2} = 1$ | $(4,1) = R(2,2)$ |
| 18 | (4,1) | $b_{3;4} = 0$ | $(1,1) = R^{-1}(4,2)$ |
| 19 | (1,1) | $\beta_{3;1} = 1$ | $(0,1) = R(1,3)$ |

Thus 4-bit wide control signals of the ascending order and interleaved access orders have been solved for the 4-tuple butterfly network to route data values to and from the four RAMs. The control bits are listed in Table 11 access by access for k=0,1,2,3, and 4.

TABLE 11

| | Ascending order bits | | | | Interleaved order bits | | | |
|---|---|---|---|---|---|---|---|---|
| k | $b_{0,k}$ | $b_{1,k}$ | $b_{2,k}$ | $b_{3,k}$ | $\beta_{0;k}$ | $\beta_{1;k}$ | $\beta_{2;k}$ | $\beta_{3;k}$ |
| 0 | 0 | 0 | 1 | 0 | 0 | 0 | 1 | 1 | 1 |
| 1 | 1 | 1 | 0 | 1 | 1 | 0 | 0 | 0 | 1 |
| 2 | 1 | 1 | 1 | 0 | 1 | 0 | 1 | 1 | 1 |
| 3 | 1 | 0 | 1 | 0 | 1 | 1 | 1 | 0 | 1 |
| 4 | 0 | 1 | 0 | 0 | 0 | 1 | 1 | 1 | 0 |

FIG. 3C depicts at a general level how to produce from control signals 320, 322 of the ascending order access and the interleaver order and from the 2-part RAM addresses of a reduced interleaver 310 an address generator 202B that can be used to access RAMs via a corresponding butterfly network. In the case of the 4-tuple butterfly network physical addresses of ascending order access are vectors (k, k, k, k) on buses 0, 1, 2, 3, respectively, for k=0, 1, 2, 3, and 4. Table 12 illustrates physical addresses and control bits of the ascending order access for the 4-tuple butterfly network.

TABLE 12

| | Ascending order physical addresses | | | | Ascending order control bits | | | |
|---|---|---|---|---|---|---|---|---|
| k | bus0 | bus1 | bus2 | bus3 | $b_{0,k}$ | $b_{1,k}$ | $b_{2,k}$ | $b_{3,k}$ |
| 0 | 0 | 0 | 0 | 0 | 0 | 1 | 0 | 0 |
| 1 | 1 | 1 | 1 | 1 | 1 | 0 | 1 | 1 |
| 2 | 2 | 2 | 2 | 2 | 1 | 1 | 0 | 1 |
| 3 | 3 | 3 | 3 | 3 | 1 | 0 | 1 | 0 |
| 4 | 3 | 3 | 3 | 3 | 0 | 1 | 0 | 0 |

Interleaved order physical addresses may be deduced from a reduced turbo interleaver by removing bus indexes from 2-part RAM addresses. Physical addresses and control bits of the interleaved order physical addresses of the 4-tuple butterfly are listed in Table 13. The reduced interleaver is taken from Table 5 and bus indexes are leaved out.

TABLE 13

| | Ascending order physical addresses | | | | Ascending order control bits | | | |
|---|---|---|---|---|---|---|---|---|
| k | bus0 | bus1 | bus2 | bus3 | $\beta_{0;k}$ | $\beta_{1;k}$ | $\beta_{2;k}$ | $\beta_{3;k}$ |
| 0 | 3 | 3 | 1 | 2 | 0 | 1 | 1 | 1 |
| 1 | 1 | 4 | 2 | 0 | 0 | 0 | 0 | 1 |
| 2 | 0 | 1 | 4 | 3 | 0 | 1 | 1 | 1 |
| 3 | 2 | 4 | 3 | 1 | 1 | 1 | 0 | 1 |
| 4 | 4 | 2 | 0 | 0 | 0 | 1 | 1 | 0 |

In this particular example, Table 12 and Table 13 have access information that a physical address unit 202B of a turbo decoder applies for accessing the four RAMs via the 4-tuple butterfly network. The interleaver order physical address vectors in Table 13 are permuted by a 4-tuple butterfly network as in FIG. 2B before accessing the memories RAM0, RAM1, RAM2, and RAM3. For example, the physical address vector (1, 4, 2, 0) of the $2^{nd}$ interleaved access (k=1) has the control bits (0, 0, 0, 1) for the 4-tuple butterfly network. The physical interleaved address vector (1, 4, 2, 0) is fed to the butterfly network from left to right. Then a permuted physical address vector is (1, 0, 2, 4) whose components are applied to access RAM0, RAM1, RAM2, and RAM3, respectively.

Below is an exemplary Ansi-C computer program for directly solving control bits of butterfly networks for both the linear (ascending) and the interleaved access orders and the 8-tuple parallel access noted above. While this only solves control bits for the first/left column of FIG. 2A (in the algorithm below $b_0$ through $b_3$ are the control bits which are applied to the same $b_x$ switches of FIG. 2A), the computer program code below can be readily extended to the other columns also.

Immediately below is an example Ansi-C code for solving control bits $b_0$ through $b_3$ of FIG. 2A, with explanatory text in bold:

```
for(i= 0; i<nBfn; i++) /* looking for a free cross-bars */
{
    if(b->x[i/4].bfn[12+(i&3)] == 0)
    {
        m = i/4; /* free cross-bar found, mark a start index and bus */
        mBus = 2*(i&3); /*an entry bus can be one of 0, 2, 4, 6 */
        mi = m;
        miBus = mBus;
        do
        {
            bfnBit = mBus/2;
            b->x[m].bfn[bfnBit] = (mBus)&1; /* assign a control bit */
            b->x[m].bfn[12+bfnBit] = 1; /*this cross bar done */
            mBusPair = mBus^1; /* select a free neighboring bus */
            minv = deInterleaver->x[m].address[mBusPair]; /* go to
interleaved, deinterleaver is a reduced inverse Interleaver R−1 */
            minvBus = deInterleaver->x[m].bus[mBusPair]; /* access
scheme */
            bfnBitInv = minvBus/2;
                mInvBusPair = minvBus^1; /* a pair bus */
            bi->x[mInv].bfn[bfnBitInv] = (mInvBusPair)&1; /* assign a
control bit */
            m = interleaver->x[minv].address[mInvBusPair]; /* return
back to*/
            mBus = interleaver->x[mInv].bus[mInvBusPair]; /* ascending
access scheme, interleaver is a reduced turbo interleaver R */
        }
        while((mi != m) || (miBus != mBus)); /* process returns to the
start node */
    }
}
```

Immediately below is an example Ansi-C program which shows how to map from a multiple access scheme currently in commercial use to a unified multiple access scheme for an 8-tuple butterfly network.

```
Nm=N−8;
for(i=0; i<N; i++)
{
k=0;
bus=0;
if(i<Nm)/*8-tuple mirror access mapping */
{
    if(i<(Nm/2))
    {
        k=i/4+1;
        bus=(i&3);
    }
    else
    {
        k=Nm/4−i/4;
        bus=4+(i&3);
    }
}
else
{
    k=0;
    bus=(i&7);
}
logical=originalInterleaver→x[i];
phyBus=0;
if(logical<Nm)/*8-tuple mirror access mapping for
    addresses */
{
    if(logical<(Nm/2))
    {
    physical=logical/4+1;
        phyBus=(logical&3);
    }
    else
    {
        physical=Nm/4−logical/4;
        phyBus=4+(logical&3);
    }
}
else
{
    physical=0;
    phyBus=(logical&7);
}
newInterleaver→x[k].address[bus]=physical;
newInterleaver→x[k].bus[bus]=phyBus;
newInverseInterleaver→x[physical].address[phyBus]=k;
newInverseInterleaver→x[physical].bus[phyBus]=bus;
}
```

One technical effect of certain embodiments of these teachings (the first part, solving the control bits) is that fewer memory spaces are needed for turbo decoding than earlier solutions. For example, in the 8-tuple parallel access, the multiple access function needs three bits per value, and there are two sets of values, one for an ascending order access scheme and other one for an interleaved order access scheme, so that a total number of bits needed is then 3*N*2=6*N bits (N being the length of the turbo interleaver). Embodiments of these teachings need only twelve control bits per 8-tuple and there are two such sets of control bits, plus four bits per 8-tuple for bookkeeping, which yields 12*(N/8)*2+4*N/8=3N+N/2=3.5*N bits total. Moreover, the solved control bits are ready to use in exemplary embodiments of these teachings whereas earlier solutions have to map multiple access function values to control bits as a separate step. One technical effect of certain embodiments of these teachings (the second part, replacing the original multiple access schemes with physical memory addresses combined with bus identifiers) allows faster algorithms for solving control bits of butterfly networks than current methods. Indexes of the buses are then available as a part of the physical memory addresses and need not be calculated as a separate step.

Now are detailed with reference to FIG. 10 further particular exemplary embodiments from the perspective of an electronic device such as for example a mobile terminal, a base station, or one or more components thereof (modem, processor in combination with a software program tangibly stored on a memory, etc.) which utilise a turbo decoder.

FIG. 10 is a logic flow diagram which may be considered to illustrate the operation of an example of a method, and a result of execution of a computer program stored in a computer readable memory, and a specific manner in which components of an electronic device are configured to cause that electronic device to operate. The various blocks shown in FIG. 10 may also be considered as a plurality of coupled logic circuit elements constructed to carry out the associated function(s), or specific result of strings of computer program code stored in a memory.

Such blocks and the functions they represent are non-limiting examples, and may be practised in various components such as integrated circuit chips and modules, and the exemplary embodiments of this invention may be realised in an apparatus that is embodied as an integrated circuit. The integrated circuit, or circuits, may include circuitry (as well as possibly firmware) for embodying at least one or more of a data processor or data processors, a digital signal processor or processors, baseband circuitry and radio frequency circuitry that are configurable so as to operate in accordance with the exemplary embodiments of this invention.

FIG. 10 begins at block 1002 which summarises that directly solving control bits for a butterfly network of switches, iteratively for each successive functional column of the switches, so as to route data values in parallel according to a multiple access scheme through the butterfly network of switches to a plurality of memory spaces; includes:

for each of the data values, generating an address of one of the memory spaces with an appended bus index leading into the butterfly network of switches based on the multiple access scheme; and applying the solved control bits to the switches of the butterfly network so as to solve control bits to a next functional column of the butterfly network of switches in a linear order access and in an interleaved order access by starting from the bus index and the physical address k.

A multiple access scheme determines how a logical address is replaced by a bus index and a physical address. For example, if j 32 $a_i(k)$, j is in $\{0,1,2, \ldots, N-1\}$, i is in $\{0,1,2, \ldots, 2^y-1\}$, and k is in $\{0,1,2, \ldots, N/2^y-1\}$, then j is replaced by (k,i), k is a physical address and i is a bus index.

Block 1004 gives an additional step further to block 1002. Specifically after detecting a switch in a functional column of the butterfly network in a linear order access having an unsolved control bit (this represents an iterative outer loop to search for untreated switches), a start bus index j and a start physical address k are computed for the detected switch for the linear order access. Other bus indexes and physical addresses for the linear order access are obtained from a reduced turbo interleaver at bus indexes and physical addresses of an interleaved access order one bus index and one address at time. Then control bits are solved by looping through a sequence of switches in the same functional column of the butterfly network in different parallel accesses until retuning back to the start bus and the start physical address. Block 1004 gives further details for how the control bits are directly solved; namely, for each of $2^y$ data values to be read from or written to one of $2^y$ memory spaces in parallel (y is a non-negative integer), functional column by functional column for switches of the butterfly network, a control bit of a switch for the linear order access is solved on a route from a bus of an index for the linear order access to one of the $2^y$ memory spaces with a physical address for the linear order access of the $2^y$ data values in parallel.

Block 1006 gives additional details for the interleaved order. A bus index $n_{k,j}$ and a physical address $m_{k,j}$ for the interleaved order access are obtained from a reduced de-interleaver at a bus index and a physical address of a linear order access. And for this interleaved order access, directly solving the control bits additionally includes, functional column by functional column for switches of the butterfly network, solving an interleaved order access control bit $\beta_{j,k}$ of a switch on a route or path from the bus of the bus index for the interleaved order access to one of the $2^y$ memory spaces with the physical address for the interleaved order access of the $2^y$ data values in parallel. Solving one of these switch control bits in relation to the bus is shown by example at FIGS. 7 to 9 and the related description.

Not shown particularly at FIG. 10, applying the solved control bits as said in block 1002 includes outputting to a memory address unit of the reduced turbo interleaves:

the physical addresses for the linear order access of the $2^y$ data values in parallel and for the interleaved order access of the $2^y$ data values in parallel;

a first set of control bits which include all of the solved linear order access control bits $b_{j,k}$ for the linear order access of the $2^y$ data values in parallel; and a second set of control bits which include all of the solved interleaved order access control bits $\beta_{j,k}$ for the interleaved order access of the $2^y$ data values in parallel.

Another way to characterise the block 1002 step of directly solving the control bits is:

for an entry switch of the butterfly network, assigning one control bit of a $k_1$:th linear order access and computing an exit bus index $k_{exit;1}$ for the entry switch;

obtaining a next entry switch of the butterfly network for the interleaved order access by setting $(k_2; k_{bus;2}) = R^{-1}(k_1, k_{exit;1})$ and assigning a next control bit, in which address $k_2$ corresponds to the $k_2$:th interleaved order access and bus index $k_{bus;2}$ identifies an entry bus to the butterfly network;

obtaining a next exit bus index $k_{exit;2}$ for the next entry switch;

determining a next subsequent address of a next subsequent linear access order switch by setting $(k_3; k_{bus;3}) = R(k_2, k_{exit;2})$;

and iteratively repeating the above steps, functional column by functional column, for all switches of the butterfly network.

Another way to characterise the generating step at Block 1002 is:

for the linear order access, replacing parallel linear order access vectors with new parallel linear order access vectors which each include an address k of one of the data values and a bus index j which identifies a linear order access input bus to the butterfly network; and for the interleaved order access, replacing parallel interleaved order access vectors with new parallel interleaved order access vectors which each include an address $n_{k,j}$ of one of the data values and a bus index $m_{k,j}$ which identifies an interleaved order access input bus to the butterfly network.

Figure 11:
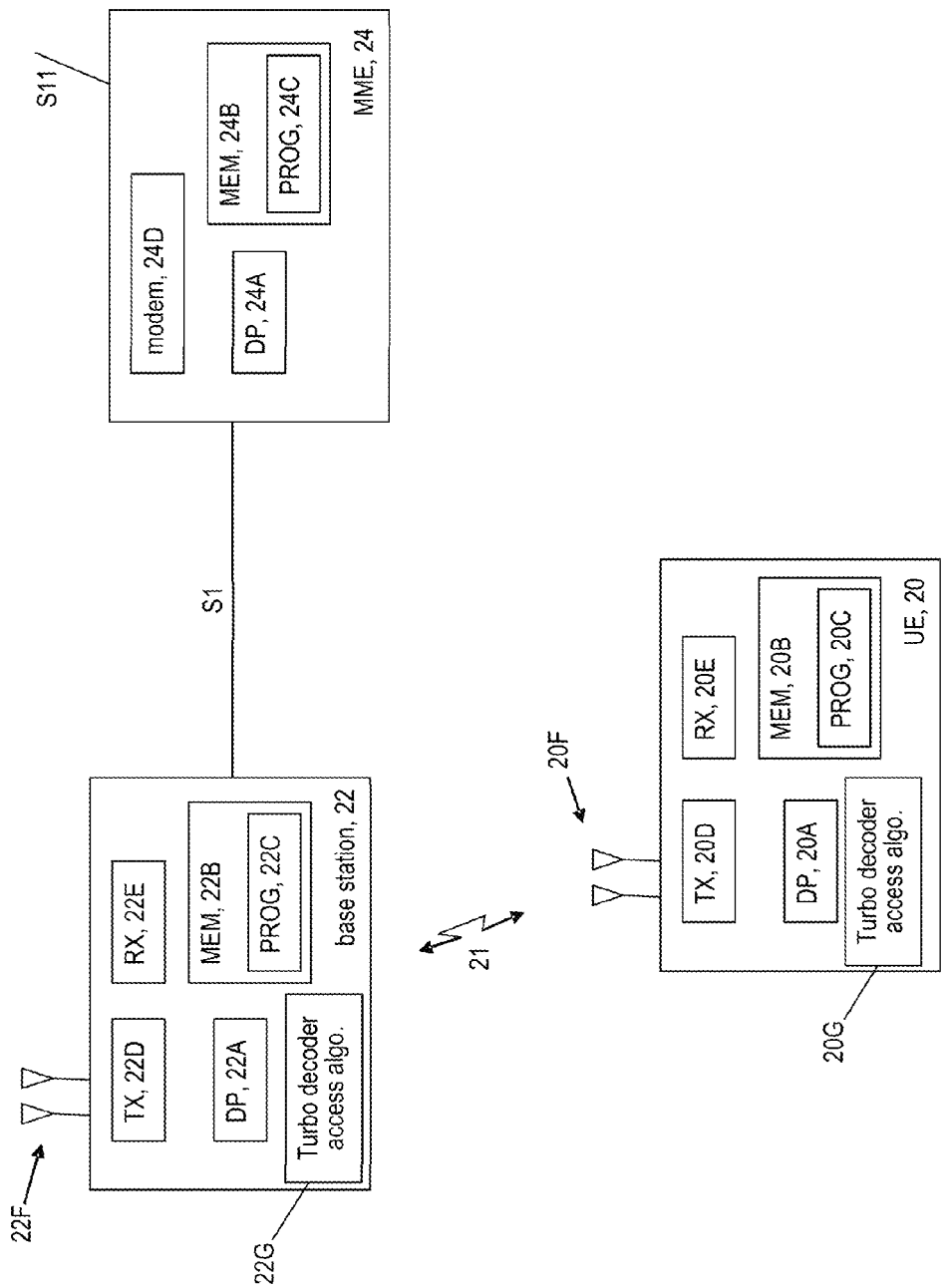
FIG. 11 shows a schematic block diagram of an example of a base station with a higher network node/MME, a gateway and a sensor system, which are exemplary electronic devices suitable for use in practising the exemplary embodiments of this invention.

Reference is now made to FIG. 11 for illustrating a simplified block diagram of examples of various electronic devices and apparatus that are suitable for use in practising the exemplary embodiments of this invention. These are not limiting but are seen as exemplary devices which can use these teachings to advantage. In FIG. 11 a wireless network (base station/access node 22 and mobility management entity MME 24) is adapted for communication over a wireless link 21 with an apparatus 20, such as a user equipment, mobile terminal or other mobile wireless radio device. The mobility management entity 24 may provide connectivity with further networks, such as for example a publicly switched telephone network PSTN and/or a data communications network/Internet over the S11 interface, and is communicatively coupled to other MMEs (not shown).

The mobile wireless radio device or UE 20 includes processing means such as at least one digital processor (DP) 20A, storing means such as at least one computer-readable memory (MEM) 20B storing at least one computer program (PROG) 20C, communicating means such as a transmitter TX 20D and a receiver RX 20E for bidirectional wireless communications with the base station 22 via one or more antennas 20F.

The wireless access node/base station 22 also includes processing means such as at least one digital processor (DP) 22A, storing means such as at least one computer-readable memory (MEM) 22B storing at least one computer program (PROG) 22C, and communicating means such as a transmitter TX 22D and a receiver RX 22E for bidirectional wireless communications with the mobile wireless radio device 20 via one or more antennas 22F. There is also a data and/or control path S1 coupling the base station 22 to the mobility management entity 24.

Shown for each of the mobile wireless radio device 20 and the base station 22 is a turbo decoder access algorithm 20G/22G for solving the control bits of a butterfly network column by column and for appending bus information to memory address spaces as detailed further above by example. The MME 24 detailed below may also have similar functionality.

Similarly, the mobility management entity 24 includes processing means such as at least one digital processor (DP) 24A, storing means such as at least one computer-readable memory (MEM) 24B storing at least one computer program (PROG) 24C, and communicating means such as a modem 24D for bidirectional communications with the base station 22 and with outside networks (through a system architecture evolution SAE gateway or similar) via the interface S11. While not particularly illustrated for the mobile wireless radio device 20 or base station 22, those devices are also assumed to include as part of their wireless communicating means a modem which may be inbuilt on an RF front end chip within those devices 20, 22 and which also carries the TX 20D/22D and the RX 20E/22E.

At least one of the PROGs 22C in the base station 22 and/or within the mobile wireless radio device 20 and/or the MME 24 is assumed to include program instructions that, when executed by the associated DP 22A/20A/24A, enable the device to operate in accordance with the exemplary embodiments of this invention which are detailed above. In this regard, the exemplary embodiments of this invention may be implemented at least in part by computer software stored on the MEM 22B/20B/24B which is executable by the DP 22A/20A/24A of the base station 22/mobile wireless radio device 20/MME24; or by hardware, or by a combination of tangibly stored software and hardware (and tangibly stored firmware). Electronic devices implementing these aspects of the invention need not be the entire base station 22 or mobile wireless radio device 20 or MME 24, but exemplary embodiments may be implemented by one or more components of same such as the above described tangibly stored software, hardware, firmware and DP, or a system on a chip SOC or an application specific integrated circuit ASIC or a digital signal processor DSP.

Various embodiments of the computer readable MEMs 20B/22B/24B include any data storage technology type which is suitable to the local technical environment, including but not limited to semiconductor based memory devices, magnetic memory devices and systems, optical memory devices and systems, fixed memory, removable memory, disc memory, flash memory, DRAM, SRAM, EEPROM and the like. Various embodiments of the DPs 20A/22A/24A include but are not limited to general purpose computers, special purpose computers, microprocessors, digital signal processors (DSPs) and multi-core processors.

The above embodiments are to be understood as illustrative examples of the invention. Further embodiments of the invention are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

What is claimed is:

1. A method comprising:
   directly solving control bits for a butterfly network of switches iteratively for each successive functional column of the switches so as to route data values in parallel according to a multiple access scheme through the butterfly network of switches to a plurality of memory spaces by:
   for each of the data values, generating an address of one of the memory spaces with an appended bus index leading into the butterfly network of switches based on the multiple access scheme;
   detecting a switch in a functional column of the butterfly network in a linear order access having an unsolved control bit;
   determining a bus index j and a physical address k for the switch in input of the butterfly network in a linear order access;
   applying the solved control bits to the switches of the butterfly network so as to solve control bits to a next functional column of the butterfly network of switches in a linear order access and in an interleaved order access by starting from the bus index j and the physical address k; and
   moving from the butterfly network of switches in the linear order to the butterfly network of switches in the interleaved order by a reduced turbo de-interleaver and from the butterfly network of switches in the interleaved order to the butterfly network of switches in the linear order by a reduced turbo interleaver until a sequence of control bits related to the start bus index j and the start physical address k has been solved.

2. A method according to claim 1, further comprising:
   entering to the butterfly network of a linear order access along a bus of an index b and with a physical address c;
   and in which directly solving the control bit of a switch comprises:
   for each of $2^y$ data values to be read from or written to one of $2^y$ memory spaces in parallel, where y is a non-negative integer, functional column by functional column for switches of the butterfly network of y columns, solving a linear order access control bit of the switch on a route from the b:th bus for the linear order access to one of the $2^y$ memory spaces with the physical address c for the linear order access of the $2^y$ data values in parallel; and
   deriving an exit bus index from the butterfly network corresponding to another input pin of the switch and the b:th bus.

3. A method according to claim 2, further comprising:
entering to the butterfly network of an interleaved order access along a bus of an index m and with a physical address n and in which directly solving the control bit of a switch comprises:
functional column by functional column for switches of the butterfly network of y columns, solving an interleaved order access control bit of the switch on a route from the m:th bus for the interleaved order access to one of the $2^y$ memory spaces with the physical address n for the interleaved order access of the $2^y$ data values in parallel; and
deriving an exit bus index from the butterfly network corresponding to another input pin of the switch and the m:th bus.

4. A method according to claim 3, in which applying the solved control bits to the switches of the butterfly network so as to route the data values comprises outputting to a memory address unit of a turbo decoder:
the physical addresses for the linear order access of the $2^y$ data values in parallel and for the interleaved order access of the $2^y$ data values in parallel;
a first set of control bits which comprise all of the solved linear order access control bits $b_{j;k}$ for the linear order access of the $2^y$ data values in parallel; and
a second set of control bits which comprise all of the solved interleaved order access control bits $\beta_{j;k}$ for the interleaved order access of the $2^y$ data values in parallel.

5. A method according to claim 4, further comprising passing the physical addresses for the interleaved order access to the turbo decoder by permuting interleaved physical address vectors by the butterfly network with corresponding ones of the solved interleaved order access control bits $\beta_{j;k}$.

6. A method according to claim 2, in which deriving the exit bus index comprises:
applying some of the solved control bits for previous functional columns of the butterfly network to calculate the exit bus index to the switch along a part of the butterfly network.

7. A method according to claim 1, in which directly solving the control bits comprises:
for an entry bus of the butterfly network, assigning one control bit of a switch of a $k_1$:th linear order access and computing an exit bus index $k_{exit;1}$ for the switch;
obtaining a next entry bus of the butterfly network for the interleaved order access by setting $(k_2; k_{bus;2})=R^{-1}(k_1, k_{exit;1})$ and assigning a next control bit of a switch, in which address $k_2$ corresponds to the $k_2$:th interleaved order access and bus index $k_{bus;2}$ identifies an entry bus to the butterfly network;
obtaining a next exit bus index $k_{exit;2}$ for the switch;
determining a next subsequent address of a next subsequent linear access order bus by setting $(k_3; k_{bus;3})=R(k_2, k_{exit;2})$;
and iteratively repeating the above steps until returning back to the start bus and start physical address, then $(k_3, k_{bus;})=(k, j)$, functional column by functional column, for all switches of the butterfly network.

8. A method according to claim 1, in which the multiple access scheme is characterised by having address functions $a_j(k)$ for $j=0,1,2,\ldots,2^y-1$ and for $k=0, 1, 2, \ldots, N/2^y-1$, where N is a length of a turbo interleaver;
and generating for each of the data values an address of one of the memory spaces with an appended bus index comprises:
for the linear order access, replacing each vector component $a_j(k)$ of parallel linear order multiple access vectors with new parallel linear order access vectors in which each component comprises an address k of one of the data values and a bus index j which identifies a linear order access input bus to the butterfly network; and
for the interleaved order access, replacing each vector component $T(a_j(k))$ of parallel interleaved order multiple access vectors with new parallel interleaved order access vectors in which each component comprises an address $n_{k,j}$ of one of the data values and a bus index $m_{k,j}$ which identifies an interleaved order access input bus to the butterfly network and the address $n_{k,j}$ and the bus index $m_{k,j}$ are related to the vector component $T(a_j(k))$ by the equation $T(a_j(k))=a_{mk,j}(n_{k,j})$.

9. Apparatus for controlling a turbo decoder, the apparatus comprising a processing system which includes at least one memory including computer program code and at least one processor, in which the processing system is configured to cause the apparatus to directly solve control bits for a butterfly network of switches iteratively for each successive functional column of the switches so as to route data values in parallel according to a multiple access scheme through the butterfly network of switches to a plurality of memory spaces by:
for each of the data values, generating an address of one of the memory spaces with an appended bus index leading into the butterfly network of switches based on the multiple access scheme;
detecting a switch in a functional column of the butterfly network in a linear order access having an unsolved control bit;
determining a bus index j and a physical address k for the switch in input of the butterfly network in a linear order access;
applying the solved control bits to the switches of the butterfly network so as to solve control bits to a next functional column of the butterfly network of switches in a linear order access and in an interleaved order access by starting from the bus index j and the physical address k; and
moving from the butterfly network of switches in the linear order to the butterfly network of switches in the interleaved order by a reduced turbo de-interleaver and from the butterfly network of switches in the interleaved order to the butterfly network of switches in the linear order by a reduced turbo interleaver until a sequence of control bits related to the start bus index j and the start physical address k has been solved.

10. Apparatus according to claim 9, in which the processing system is configured to cause the apparatus to enter to the butterfly network of a linear order access along a bus of an index b and with a physical address c;
and in which directly solving the control bit of a switch comprises:
for each of $2^y$ data values to be read from or written to one of $2^y$ memory spaces in parallel, where y is a non-negative integer, functional column by functional column for switches of the butterfly network of y columns, solving a linear order access control bit of the switch on a route from the b:th bus for the linear order access to one of the $2^y$ memory spaces with the physical address c for the linear order access of the $2^y$ data values in parallel; and
deriving an exit bus index from the butterfly network corresponding to another input pin of the switch and the b:th bus.

11. Apparatus according to claim 10, in which the processing system is configured to cause the apparatus to enter to the butterfly network of an interleaved order access along a bus of an index m and with a physical address n;

and in which directly solving the control bit of a switch comprises:

functional column by functional column for switches of the butterfly network of y columns, solving an interleaved order access control bit of the switch on a route from the m:th bus for the interleaved order access to one of the $2^y$ memory spaces with the physical address n for the interleaved order access of the $2^y$ data values in parallel; and deriving an exit bus index from the butterfly network corresponding to another input pin of the switch and the m:th bus.

12. Apparatus according to claim 11, in which applying the solved control bits to the switches of the butterfly network so as to route the data values comprises outputting to a memory address unit of a turbo decoder:

the physical addresses for the linear order access of the $2^y$ data values in parallel and for the interleaved order access of the $2^y$ data values in parallel;

a first set of control bits which comprise all of the solved linear order access control bits $b_{j;k}$ for the linear order access of the $2^y$ data values in parallel; and a second set of control bits which comprise all of the solved interleaved order access control bits $\beta_{j;k}$ for the interleaved order access of the $2^y$ data values in parallel.

13. Apparatus according to claim 12, in which the processing system is configured to cause the apparatus to pass the physical addresses for the interleaved order access to the turbo decoder by permuting interleaved physical address vectors by the butterfly network with corresponding ones of the solved interleaved order access control bits $\beta_{j;k}$.

14. Apparatus according to claim 10, in which the processing system is configured to derive the exit bus index by applying some of the solved control bits for previous functional columns of the butterfly network to calculate the exit bus index to the switch along a part of the butterfly network.

15. Apparatus according to claim 9, in which directly solving the control bits comprises:

for an entry bus of the butterfly network, assigning one control bit of a switch of a $k_1$:th linear order access and computing an exit bus index $k_{exit;1}$ for the switch;

obtaining a next entry bus of the butterfly network for the interleaved order access by setting $(k_2; k_{bus;2}) = R^{-1}(k_1, k_{exit;1})$ and assigning a next control bit of a switch, in which address $k_2$ corresponds to the $k_2$:th interleaved order access and bus index $k_{bus;2}$ identifies an entry bus to the butterfly network;

obtaining a next exit bus index $k_{exit;2}$ for the switch;

determining a next subsequent address of a next subsequent linear access order bus by setting $(k_3; k_{bus;3}) = R(k_2, k_{exit;2})$;

and iteratively repeating the above steps until returning back to the start bus and start physical address, then $(k_3, k_{bus;3}) = (k, j)$, functional column by functional column, for all switches of the butterfly network.

16. Apparatus according to claim 9, in which the multiple access scheme is characterised by having address functions $a_j(k)$ for $j = 0, 1, 2, \ldots, 2^y - 1$ and for $k = 0, 1, 2, \ldots, N/2^y - 1$, where N is a length of a turbo interleaver;

and generating for each of the data values an address of one of the memory spaces with an appended bus index comprises:

for the linear order access, replacing each component $a_j(k)$ of parallel linear order multiple access vectors with new parallel linear order access vectors in which each component comprises an address k of one of the data values and a bus index j which identifies a linear order access input bus to the butterfly network; and for the interleaved order access, replacing each vector component $T(a_j(k))$ of parallel interleaved order multiple access vectors with new parallel interleaved order access vectors in which each component comprises an address $n_{k,j}$ of one of the data values and a bus index $m_{k,j}$ which identifies an interleaved order access input bus to the butterfly network and the address $n_{k,j}$ and the bus index $m_{k,j}$ are related to the vector component $T(a_j(k))$ by the equation $T(a_j(k)) = a_{mk,j}(n_{k,j})$.

17. A non-transitory computer-readable memory comprising a set of instructions, which, when executed on a turbo decoder, causes the turbo decoder to perform the steps of:

directly solving control bits for a butterfly network of switches iteratively for each successive functional column of the switches so as to route data values in parallel according to a multiple access scheme through the butterfly network of switches to a plurality of memory spaces by:

for each of the data values, generating an address of one of the memory spaces with an appended bus index leading into the butterfly network of switches based on the multiple access scheme;

detecting a switch in a functional column of the butterfly network in a linear order access having an unsolved control bit;

determining a bus index j and a physical address k for the switch in input of the butterfly network in a linear order access;

applying the solved control bits to the switches of the butterfly network so as to solve control bits to a next functional column of the butterfly network of switches in a linear order access and in an interleaved order access by starting from the bus index j and the physical address k; and moving from the butterfly network of switches in the linear order to the butterfly network of switches in the interleaved order by a reduced turbo de-interleaver and from the butterfly network of switches in the interleaved order to the butterfly network of switches in the linear order by a reduced turbo interleaver until a sequence of control bits related to the start bus index j and the start physical address k has been solved.

18. A computer-readable memory according to claim 17, wherein the steps further comprise:

entering to the butterfly network of a linear order access along a bus of an index b and with a physical address c and in which directly solving the control bit of a switch comprises:

for each of $2^y$ data values to be read from or written to one of $2^y$ memory spaces in parallel, where y is a non-negative integer, functional column by functional column for switches of the butterfly network of y columns, solving a linear order access control bit of the switch on a route from the b:th bus for the linear order access to one of the memory spaces with the physical address c for the linear order access of the $2^y$ data values in parallel; and deriving an exit bus index from the butterfly network corresponding to other input pin of the switch and the b:th bus.

19. A computer-readable memory according to claim 18, wherein the steps further comprise:

entering to the butterfly network of an interleaved order access along a bus of an index m and with a physical address n and in which directly solving the control bit of a switch comprises:
   functional column by functional column for switches of the butterfly network of y columns, solving an interleaved order access control bit of the switch on a route from the m:th bus for the interleaved order access to one of the $2^y$ memory spaces with the physical address n for the interleaved order access of the $2^y$ data values in parallel; and
   deriving an exit bus index from the butterfly network corresponding to other input pin of the switch and the m:th bus.

20. A computer-readable memory according to claim 19, in which applying the solved control bits to the switches of the butterfly network so as to route the data values comprises outputting to a memory address unit of a turbo decoder:
   the physical addresses for the linear order access of the $2^y$ data values in parallel and for the interleaved order access of the $2^y$ data values in parallel;
   a first set of control bits which comprise all of the solved linear order access control bits $b_{j;k}$ for the linear order access of the $2^y$ data values in parallel; and
   a second set of control bits which comprise all of the solved interleaved order access control bits $\beta_{j;k}$ for the interleaved order access of the $2^y$ data values in parallel.

21. A computer-readable memory according to claim 20, wherein the steps further comprise passing the physical addresses for the interleaved order access to the turbo decoder by permuting interleaved physical address vectors by the butterfly network with corresponding ones of the solved interleaved order access control bits $\beta_{j;k}$.

22. A computer-readable memory according to claim 18, in which deriving the exit bus index comprises:
   applying some of the solved control bits for previous functional columns of the butterfly network to calculate the exit bus index to the switch along a part of the butterfly network.

23. A computer-readable memory according to claim 17, in which directly solving the control bits comprises:
   for an entry bus of the butterfly network, assigning one control bit of a switch of a $k_1$:th linear order access and computing an exit bus index $k_{exit;1}$ for the switch;
   obtaining a next entry bus of the butterfly network for the interleaved order access by setting $(k_2; k_{bus;2}) = R^{-1}(k_1, k_{exit;1})$ and assigning a next control bit of a switch, in which address $k_2$ corresponds to the $k_2$:th interleaved order access and bus index $k_{bus;2}$ identifies an entry bus to the butterfly network;
   obtaining a next exit bus index $k_{exit;2}$ for the switch;
   determining a next subsequent address of a next subsequent linear access order bus by setting $(k_3; k_{bus;3}) = R(k_2, k_{exit;2})$;
   and iteratively repeating the above steps until returning back to the start bus and start physical address, then $(k_3, k_{bus;3}) = (k, j)$, functional column by functional column, for all switches of the butterfly network.

24. A computer-readable memory according to claim 17, in which the multiple access scheme is characterised by having address functions $a_j(k)$ for $j=0,1,2,\ldots,2^y-1$ and for $k=0,1,2,\ldots,N/2^y-1$, where N is a length of a turbo interleaver;
   and generating for each of the data values an address of one of the memory spaces with an appended bus index comprises:
      for the linear order access, replacing each vector component $a_j(k)$ of parallel linear order multiple access vectors with new parallel linear order access vectors in which each component comprises an address k of one of the data values and a bus index j which identifies a linear order access input bus to the butterfly network; and
      for the interleaved order access, replacing each vector component $T(a_j(k))$ of parallel interleaved order multiple access vectors with new parallel interleaved order access vectors in which each component comprises an address $n_{k,j}$ of one of the data values and a bus index $m_{k,j}$ which identifies an interleaved order access input bus to the butterfly network and the address $n_{k,j}$ and the bus index $m_{k,j}$ are related to the vector component $T(a_j(k))$ by the equation $T(a_j(k)) = a_{mk,j}(n_{k,j})$.

\* \* \* \* \*

UNITED STATES PATENT AND TRADEMARK OFFICE
CERTIFICATE OF CORRECTION

PATENT NO. : 8,446,813 B1  
APPLICATION NO. : 13/676375  
DATED : May 21, 2013  
INVENTOR(S) : Esko Juhani Nieminen et al.

It is certified that error appears in the above-identified patent and that said Letters Patent is hereby corrected as shown below:

In the Claims:

Please replace "$R^{-1(k}{}_1, k_{exit;1})$" with --$R^{-1}(k_1, {}_{exit;1})$-- at line 45 on column 25, in order to have claim 7 (column 25) read in its entirety as follows:

--7. A method according to claim 1, in which directly solving the control bits comprises:
   for an entry bus of the butterfly network, assigning one control bit of a switch of a $k_1$:th linear order access and computing an exit bus index $k_{exit;1}$ for the switch;
   obtaining a next entry bus of the butterfly network for the interleaved order access by setting $(k_2; k_{bus;2}) = (k_2; k_{bus;2}) = R^{-1}(k_1, k_{exit;1})$ and assigning a next control bit of a switch, in which address $k_2$ corresponds to the $k_2$:th interleaved order access and bus index $k_{bus;2}$ identifies an entry bus to the butterfly network;
   obtaining a next exit bus index $k_{exit;2}$ for the switch;
   determining a next subsequent address of a next subsequent linear access order bus by setting $(k_3; k_{bus;3}) = R(k_2, k_{exit;2})$;
   and iteratively repeating the above steps until returning back to the start bus and start physical address, then $(k_3, k_{bus;3}) = (k, j)$, functional column by functional column, for all switches of the butterfly network.--

Please insert --$2^y$-- between to "one of the" and "memory space" at lines 60-61 on column 28, in order to have claim 18 (column 28) read in its entirety as follows:

--18. A computer-readable memory according to claim 17, wherein the steps further comprise:
   entering to the butterfly network of a linear order access along a bus of an index $b$ and with a physical address $c$
   and in which directly solving the control bit of a switch comprises:
for each of $2^y$ data values to be read from or written to one of $2^y$ memory spaces in parallel, where y is a non-negative integer, functional column by functional column for switches of the butterfly network of y columns, solving a linear order access control bit of the switch on a route from the $b$:th Signed and Sealed this  
Second Day of July, 2013

Teresa Stanek Rea  
*Acting Director of the United States Patent and Trademark Office* bus for the linear order access to one of the $2^y$ memory spaces with the physical address c for the linear order access of the $2^y$ data values in parallel; and deriving an exit bus index from the butterfly network corresponding to other input pin of the switch and the $b$:th bus.--